United States Patent
Peng et al.

(10) Patent No.: US 12,400,837 B2
(45) Date of Patent: Aug. 26, 2025

(54) MACROSCOPIC TEXTURING FOR ANODIZED AND COATED SURFACES

(71) Applicant: Lam Research Corporation, Fremont, CA (US)

(72) Inventors: Gordon Wen-Yin Peng, San Jose, CA (US); Adrian Radocea, Fremont, CA (US); Yu Jiang, San Jose, CA (US); Mansa Rajagopalan, San Ramon, CA (US); Nicolas Londono, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 305 days.

(21) Appl. No.: 17/432,434

(22) PCT Filed: Feb. 5, 2020

(86) PCT No.: PCT/US2020/016883
§ 371 (c)(1),
(2) Date: Aug. 19, 2021

(87) PCT Pub. No.: WO2020/171958
PCT Pub. Date: Aug. 27, 2020

(65) Prior Publication Data
US 2022/0139677 A1 May 5, 2022

Related U.S. Application Data

(60) Provisional application No. 62/808,509, filed on Feb. 21, 2019.

(51) Int. Cl.
*H01J 37/32* (2006.01)
*C23C 4/02* (2006.01)
(Continued)

(52) U.S. Cl.
CPC .......... *H01J 37/32495* (2013.01); *C23C 4/02* (2013.01); *C23C 4/11* (2016.01);
(Continued)

(58) Field of Classification Search
CPC .......... H01J 37/32495; H01J 37/32642; H01J 37/32486; H01J 37/32559;
(Continued)

(56) References Cited

U.S. PATENT DOCUMENTS 6,623,595 B1 9/2003 Han et al.
8,846,163 B2 9/2014 Kao et al.
(Continued)

FOREIGN PATENT DOCUMENTS

EP     1049133 A2    11/2000
JP     2001049419 A   2/2001
(Continued)

OTHER PUBLICATIONS

IPR & Written Opinion PCT/US2020/016883, dated Sep. 2, 2021, 11 pages.
(Continued)

*Primary Examiner* — Rudy Zervigon
(74) *Attorney, Agent, or Firm* — Penilla IP, APC

(57) ABSTRACT

A consumable part for a plasma processing chamber includes a plasma facing side. An engineered surface is formed into the plasma facing side of the consumable part. A plurality of raised features defines the engineered surface, wherein features are arranged in a predefined pattern, wherein each of the plurality of raised features includes a top region having an outer edge and a sidewall. A base surface of the engineered surface is configured to surround each of the plurality of raised features, such that a corresponding sidewall of a corresponding raised feature extends up at an angle from the base surface to a corresponding top region.

(Continued)

The consumable part is configured to be installed in the plasma processing chamber. The consumable part is configured to be exposed to a plasma and byproducts of the plasma.

12 Claims, 22 Drawing Sheets

(51) Int. Cl.
    *C23C 4/11*         (2016.01)
    *C25D 11/16*      (2006.01)
    *H01L 21/683*     (2006.01)

(52) U.S. Cl.
    CPC ........ *C25D 11/16* (2013.01); *H01J 37/32642* (2013.01); *H01L 21/6831* (2013.01)

(58) Field of Classification Search
    CPC ........... H01J 37/32477; H01J 37/32532; H01J 37/32715; C23C 4/02; C23C 4/11; C23C 4/134; C23C 28/04; C23C 28/042; C25D 11/16; H01L 21/6831
    USPC ........... 118/715, 723 R; 156/345.33, 345.35, 156/345.36, 345.43; 165/345.34
    See application file for complete search history.

(56) References Cited

U.S. PATENT DOCUMENTS

| | | |
|---|---|---|
| 2003/0037880 A1 | 2/2003 | Carducci et al. |
| 2010/0059366 A1 | 3/2010 | Brueckner et al. |
| 2011/0206833 A1* | 8/2011 | Sexton .............. H01J 37/32862 427/78 |
| 2011/0232678 A1 | 9/2011 | Shih et al. |
| 2012/0258280 A1* | 10/2012 | Jackson .............. C23C 16/4404 428/156 |
| 2013/0267094 A1* | 10/2013 | Katsunuma ....... H01J 37/32669 438/694 |
| 2015/0064450 A1 | 3/2015 | Sun et al. |
| 2015/0126036 A1 | 5/2015 | Zhao |
| 2016/0155657 A1* | 6/2016 | Gopalan ............. H01L 21/68757 264/603 |
| 2018/0211819 A1 | 7/2018 | Koch et al. |
| 2021/0225616 A1* | 7/2021 | Peng .................... C23C 16/4404 |

FOREIGN PATENT DOCUMENTS

| | | | |
|---|---|---|---|
| JP | 2004 513516 A | 4/2004 | |
| JP | 2007 227443 A | 9/2007 | |
| WO | WO2014065125 A1 | 5/2014 | |
| WO | WO-2019136396 A2 * | 7/2019 | ............... B24C 1/06 |

OTHER PUBLICATIONS

SG Search Report and Written Opinion SG11202109117U, dated Jun. 1, 2023, Total 9 pages.

ISR & Written Opinion PCT/US2020/016883, dated Jun. 5, 2020, 16 pages.

Supplementary EP Search Report EP20758619, dated Sep. 26, 2022, 9 pages.

\* cited by examiner

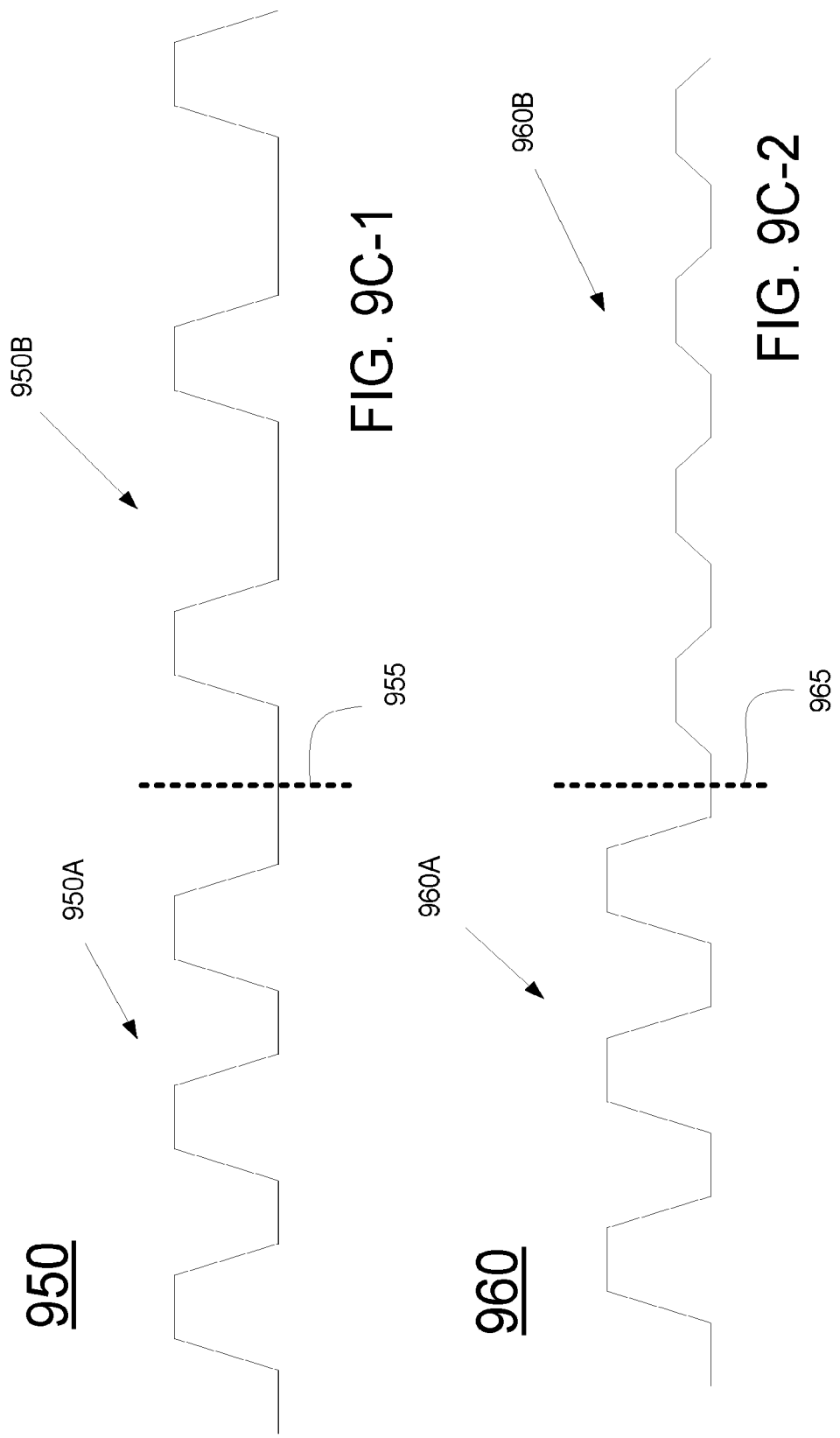

MACROSCOPIC TEXTURING FOR ANODIZED AND COATED SURFACES

CLAIM OF PRIORITY

This application is a national stage filing of and claims priority, under 35 U.S.C. § 371, to PCT/US2020/016883, filed on Feb. 5, 2020, and titled "MACROSCOPIC TEXTURING FOR ANODIZED AND COATED SURFACES", which is incorporated by reference herein in its entirety. PCT/US2020/016883 claims priority to U.S. Provisional Application No. 62/808,509 filed on Feb. 21, 2019.

TECHNICAL FIELD

The present embodiments relate to semiconductor substrate processing equipment tools, and more particularly to improved coatings applied to consumable parts of the processing equipment.

BACKGROUND OF THE DISCLOSURE

In semiconductor processing systems, such as plasma chambers, coated parts within the plasma chambers typically feature aluminum surfaces that are grit blasted to create random microscopic features to improve adhesion. The surfaces are then anodized and covered with a plasma-resistant spray-coat via plasma-spray. The surface finish is critical in determining the spray coat's adhesion strength and durability. However microscopic roughening of the surface through grit blasting does not provide sufficient adhesion of subsequently applied layers. For example, the main failure mode for spray coatings is caused by delamination from the underlying anodization. Delamination may occur more frequently near regions of surface transition (e.g., corners, edges, etc.) which promotes cracks from propagating in the spray coatings due to breaks in the surface continuity. Once the coating begins to delaminate, the part is no longer useable because the damaged spray-coat and exposed anodized aluminum lead to on-wafer metal contamination and particle defects. The currently failed/spent parts must undergo refurbishment to restore its in-chamber performance, or replacement parts must be ordered which adds to the operating cost for the semiconductor processing systems.

In addition, byproducts of wafer processes may adhere to surfaces of the semiconductor processing systems. For example, the byproducts may be generated during etching processes on a wafer or any other material as performed in an etching chamber that then attaches to components of the semiconductor processing system. Because the byproducts do not firmly adhere to the surfaces of the semiconductor processing systems, those byproducts may later be dislodged and/or shed from those surfaces under subsequent wafer processing steps and to be deposited on wafer surfaces. In one case, those byproducts adhering to the wafer surfaces lead to contamination of at least part of the wafer surface. Depending on the extent of the contamination, a portion or all of the wafer may be defective, such that damaged wafer surfaces may lead to defective chips that are formed through wafer processing. In another case, the byproducts may adhere to the electrostatic chuck, and when the byproducts are of a non-conductive material, may cause the electrostatic chuck to be unable to chuck and/or hold the wafer.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure It is in this context that embodiments of the disclosure arise.

SUMMARY

The present embodiments relate to solving one or more problems found in the related art, and specifically to include macroscopic texturing of a plasma facing surface of a consumable part to increase surface area of the plasma facing surface, thereby enhancing adhesion of additional layers by creating additional bonding sites. Several inventive embodiments of the present disclosure are described below.

Embodiments of the present disclosure include a consumable part for a plasma processing chamber. The consumable part includes a plasma facing side. An engineered surface is formed into the plasma facing side of the consumable part. A plurality of raised features defines the engineered surface. Features of the plurality of raised features are arranged in a predefined pattern. Each of the plurality of raised features includes a top region having an outer edge and a sidewall. A base surface of the engineered surface surrounds each of the plurality of raised features, such that a corresponding sidewall of a corresponding raised feature extends up at an angle from the base surface to a corresponding top region. The consumable part is configured to be installed in the plasma processing chamber. The consumable part is configured to be exposed to a plasma and byproducts of the plasma.

Other embodiments of the present disclosure include a method for building an engineered surface of a consumable part configured to be installed in a plasma processing chamber. The method includes masking a plasma facing side of the consumable part using a stencil, wherein the stencil includes a pattern of openings providing access to the plasma facing side. The method includes discriminately blasting the plasma facing side through the stencil with a blast media to create a plurality of raised features defining the engineered surface, the engineered surface being formed into the plasma facing side. Features of the plurality of raised features are arranged in a predefined pattern over the engineered surface. Each of the plurality of raised features includes a top region having an outer edge and a sidewall. A base surface of the engineered surface surrounds each of the plurality of raised features, such that a corresponding sidewall of a corresponding raised feature extends up at an angle from the base surface to a corresponding top region. The consumable part is configured to be exposed to a plasma and byproducts of the plasma.

Another embodiment of the present disclosure includes a plasma processing chamber for processing a wafer including a bottom electrode configured to support the wafer, a top electrode located over the bottom electrode, and a consumable part. The consumable part includes a plasma facing side. An engineered surface is formed into the plasma facing side of the consumable part. A plurality of raised features defines the engineered surface, wherein features of the plurality of raised features are arranged in a predefined pattern, wherein each of the plurality of raised features includes a top region having an outer edge and a sidewall. A base surface of the engineered surface surrounds each of the plurality of raised features, such that a corresponding sidewall of a corresponding raised feature extends up at an angle from the base surface to a corresponding top region.

The consumable part is configured to be installed in the plasma processing chamber. The consumable part is configured to be exposed to a plasma and byproducts of the plasma.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIG. 6B-2 illustrates the application of grit or bead blasting at multiple angles to a plasma facing side of a consumable part to build an engineered surface having macroscopic texturing in the form of raised features that are designed to create additional bonding sites for better adhesion of additional layers and/or byproducts, in accordance with one embodiment of the present disclosure.

FIG. 9A-1 illustrates a plurality of raised features uniformly arranged, wherein the features are of a uniform structure and height configured to build a conformal plasma-resistant spray-coat, wherein the raised features define an engineered surface having patterned macroscopic texturing designed to create additional bonding sites for better adhesion of additional layers and/or byproducts, in accordance with one embodiment of the present disclosure.

FIG. 9A-2 illustrates a plurality of raised features uniformly arranged with less density that the features of FIG. 9A-1, in accordance with one embodiment of the present disclosure.

FIG. 9B-1 illustrates a plurality of raised features uniformly arranged, wherein the features are of a uniform structure and height that is less than that of FIG. 9A-1 and configured to build a non-conformal plasma-resistant spray-coat that is relatively flat, wherein the raised features define an engineered surface having patterned macroscopic texturing designed to create additional bonding sites for better adhesion of additional layers and/or byproducts, in accordance with one embodiment of the present disclosure.

FIG. 9B-2 illustrates a plurality of raised features uniformly arranged with less density that the features of FIG. 9A-1, in accordance with one embodiment of the present disclosure.

FIG. 9C-1 illustrates a plurality of raised features arranged in two sub-patterns, wherein features across the sub-patterns are of a uniform structure and height, wherein the raised features define an engineered surface having patterned macroscopic texturing designed to create additional bonding sites for better adhesion of additional layers and/or byproducts, in accordance with one embodiment of the present disclosure.

FIG. 9C-2 illustrates a plurality of raised features arranged in two sub-patterns, wherein features in each sub-patterns are of a uniform structure and height, but may vary between the two sub-patterns, wherein the raised features define an engineered surface having patterned macroscopic texturing designed to create additional bonding sites for better adhesion of additional layers and/or byproducts, in accordance with one embodiment of the present disclosure.

DETAILED DESCRIPTION

Figure 1A:
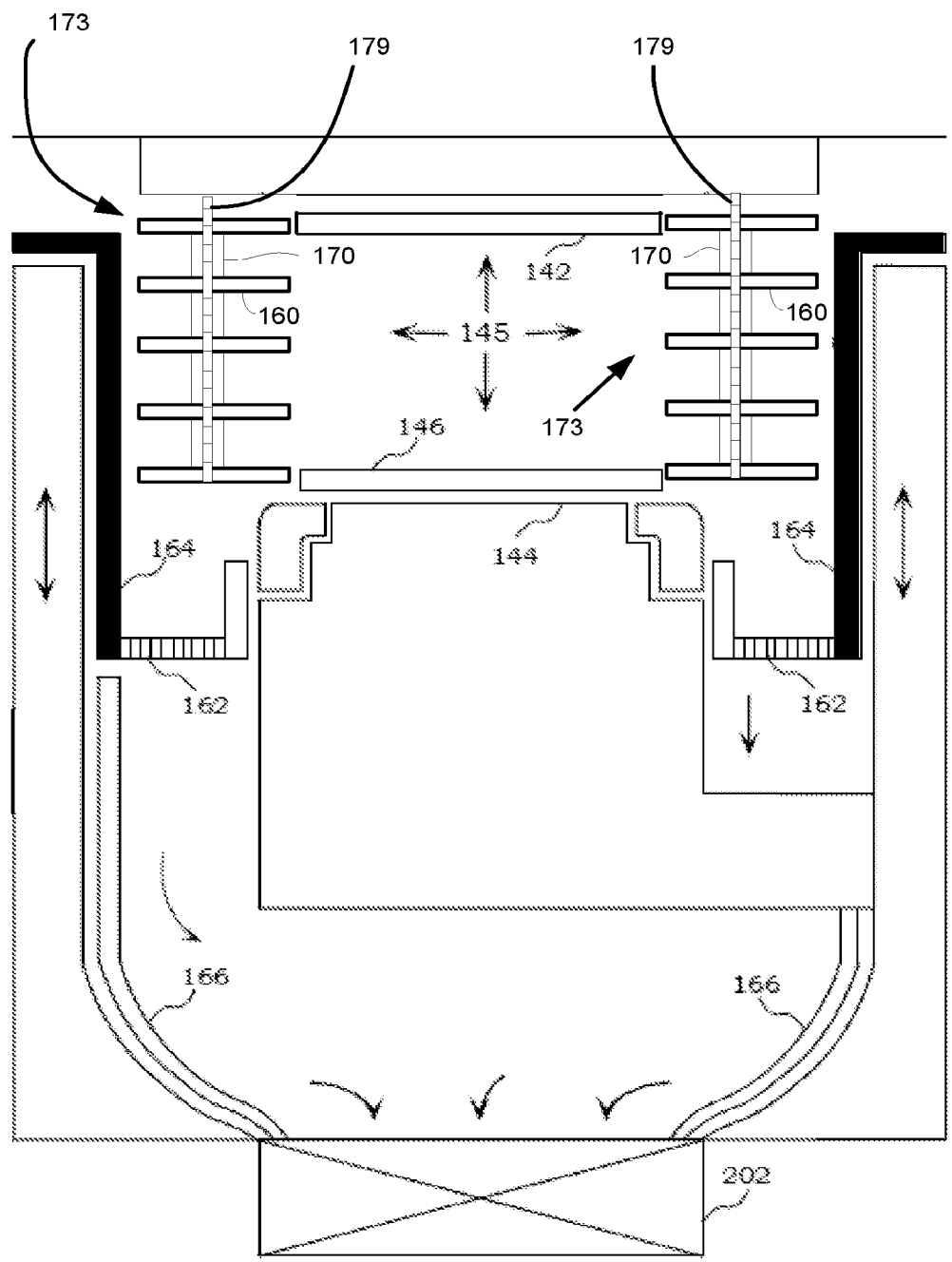
FIG. 1A illustrates an example plasma volume confinement etch chamber including at least one consumable part that includes engineered surfaces having macroscopic texturing designed to increase the surface area of a plasma facing surface for better adhesion of additional layers and/or byproducts through additional bonding sites, in accordance with one embodiment of the present disclosure.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and methods that provide a novel method for providing macroscopic texturing of surfaces for consumable parts. In embodiments of the present disclosure, macroscopic texturing adds patterned, large order-of-magnitude features onto or into the surface of the consumable part. The consumable part may be plain bulk material (e.g., bare ceramic, bare aluminum, etc.), may be anodized (e.g., anodized aluminum), and may or may not have a plasma spray coat applied, in various embodiments. The intended effects of macroscopic texturing of plasma facing surfaces for consumable parts include enhancing spray coat adhesion (or adhesion of additional layers) and/or byproduct adhesion, in embodiments. Macroscopic texturing increases the surface area of the surface of the consumable part, enhancing adhesion of subsequently applied layers (e.g., plasma resistant spray-coatings) by creating additional bonding sites (e.g., for improved Yttria spray-coating adhesion). By improving adhesion strength, the coating (as well as the consumable part's lifetime) lifetime can be extended, as one primary source of failure for a consumable part may be peeling of the spray-coating from the underlying anodization of the surface of the consumable part. Since the plasma-resistant spray-coat represents a significant fraction of the cost of the consumable part, extending the lifetime of a consumable part can significantly reduce cost of ownership of plasma-sprayed components (e.g., consumable parts) which are used for the chamber bodies of conductor etch chambers. This significantly increases the lifetime and service life of the consumable part. In addition, because the servicing lifetime of the consumable part may be extended between services, there is reduced tool down-time of the plasma processing systems. Embodiments of the present disclosure provide the above advantages, and further provide for additional advantages as the macroscopic texturing may lead to better capture and/or anchoring of byproducts formed during process steps, which leads to increased process performance as the consumable part is less likely to shed particles (e.g., byproducts) over its service life. Embodiments of the present disclosure provide the above advantages, and provide for an additional advantage as macroscopic texturing (e.g., roughening) increases the fracture resistance of coatings placed on top of the modified surface of the consumable part. Still other embodiments of the present disclosure provide the above advantages, and further provide that macroscopic texturing introduces continuous, deliberate breaks in the surface contour, which reduces large in-plane stresses from developing and causing cracks in subsequent spray-coatings. That is, the macroscopic texturing enhances film (e.g., spray-coating) stress reduction. Still other embodiments of the present disclosure provide the above advantages, and further provide that macroscopic texturing increases surface continuity (e.g., removes breaks in surface continuity) of the consumable part especially near surface transitions (e.g., corners, edges, etc.). By increasing surface continuity, cracks in the prepared surface (e.g., spray-coatings) are prevented from happening/propagating in the surface due to breaks in surface continuity.

Embodiments of the present disclosure provide for macroscopic texturing of surfaces (e.g., plasma facing surfaces) for consumable parts, wherein a consumable part may be any component that is found within a semiconductor processing assembly (e.g., plasma processing chamber). In some cases, the consumable part may be removably placed within the plasma processing chamber. As such, the consumable part may be removed for servicing and/or replacement. In that manner, the lifetime and/or service life of the plasma processing chamber may be increased. For purposes of illustration, the following list provides examples of consumable parts found within a plasma processing chamber and is not intended to be fully exhaustive, and includes a liner configured to protect an inner wall of the plasma processing chamber, one or more portions of a C-shroud, one or more portions of a plasma confinement ring, a focus ring, an edge ring, an electrostatic semiconductor wafer clamping/chucking system, an upper electrode, a bottom electrode, a pedestal configure for supporting a wafer, etc. In other cases, embodiments of the present disclosure may be provided on any plasma facing surface found within the semiconductor processing assembly, wherein the surface may be located on a consumable part or a fixed part.

Embodiments of the present disclosure relate to plasma process modules, such as those used in plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, a plasma enhanced chemical vapor deposition (PECVD) chamber or module, an atomic layer etch (ALE) chamber or module, an ion implantation chamber or module, a track chamber or module, and any other semiconductor processing systems that may be associated or used in the fabrication and/or manufacturing of semiconductor wafers to include processes such as electroplating, electroetching, electropolishing, electro chemical mechanical polishing, deposition, wet deposition, and through silicon via (TSV) processes. Further, embodiments of the present disclosure are not limited to the examples provided herein, and may be practiced in different plasma processing systems employing different configurations, geometries, and plasma-generating technologies (e.g., inductively coupled systems, capacitively coupled systems, electron-cyclotron resonance systems, microwave systems, etc.). Examples of plasma processing systems and plasma process modules are disclosed in commonly owned U.S. Pat. Nos. 8,862,855, and 8,847,495, and 8,485,128, and U.S. patent application Ser. No. 15/369,110.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

FIG. 1A illustrates an exemplary plasma processing chamber 100A (e.g., plasma volume confinement etch chamber) including at least one consumable part that includes engineered surfaces having macroscopic texturing designed to increase the surface area of a plasma facing surface for better adhesion of additional layers and/or byproducts through additional bonding sites, in accordance with one embodiment of the present disclosure. The plasma processing chamber 100A includes a top electrode 142 and a bottom electrode 144 with a semiconductor wafer 146 disposed thereon. The etch chamber 100A is shown configured for a small plasma volume confinement with plasma confinement rings 160 positioned to define the lateral boundaries of the small plasma volume confinement region 145. The top electrode 142 and the bottom electrode 144 with the semiconductor wafer 146 disposed thereon define the top and bottom boundaries of the small volume plasma confinement region 145, respectively.

The configurable plasma processing chamber 100A includes an outer plasma confinement structure 162 which is functional as a plasma confinement structure 162 when the plasma processing chamber 100A is configured for large plasma volume. When the plasma processing chamber 100A is configured for a small volume, the outer plasma confinement structure 162 remains in place providing a redundant baffle through which neutral species of the plasma must pass when exhausting from the etch chamber through turbopump 202.

In one embodiment, plasma confinement rings 160 are configured to extend between a peripheral edge of the upper electrode 142 and a peripheral edge of the lower electrode 146 so that the plasma created by the ionization of the reactive gases with applied RF energy is confined within the small plasma volume confinement region 145 defined between the confinement rings 160 and the electrodes 142, 144 just over the surface of the wafer 146. The plasma confinement rings 160 may define a slotted confinement shield constructed of a plurality of circular rings 160. The circular rings 160 are constructed of a dielectric such as silica or quartz, and adjacent rings are separated by spacers 170 creating circumferential slots or passages between the circular rings 160 through which neutral species of the plasma are exhausted. The circumferential slots thereby form parallel passages that are spaced apart in a direction normal to the flow of plasma or gasses through the parallel passages.

The spacers 170 are similarly constructed of a dielectric such a silica or quartz, or conducting materials such as silicon carbide or doped silicon, and the slots or passages are configured to extinguish any ion particles remaining in the exhausting gases which flow through the confinement rings 160, and through the chamber 100A to exhaust through turbopump 202. In one embodiment, the plasma confinement rings 160 are connected by shafts 179. The shafts 179 can be constructed of a lightweight, low particulate-generating substance such as nylon, and are configured to support the confinement rings 160 and spacers 170. The spacers are configured to telescope around the shafts 179 and between the confinement rings 160 to create the desired space between rings to neutralize any ion particles or electrons from the plasma that may traverse the slots or passages when the plasma confinement rings 160 are extended to define a small plasma volume confinement region 145.

The plasma confinement rings 160, spacers 170, and shafts 179 together form a confinement assembly 173. When the confinement assembly 173 is retracted to configure a large plasma volume confinement region 145, the shafts 179 withdraw from the confinement region 145, collapsing the spacers 170 within adjacent rings 160 and thereby collapsing the stack of plasma confinement rings 160. In particular, the large plasma volume is created with boundaries extending to a chamber liner 164 configured in the plasma processing chamber 100A, and the outer plasma confinement structure 162.

Plasma protection chamber liners 164, 166 may be incorporated to provide thermal stability, an adequate RF ground return path, and serviceability with minimal downtime. Chamber liners 164, 166 may also be configured to provide additional protection to the walls of the plasma processing chamber 100A, such that the liners are exposed to plasma processes instead of having the walls being exposed to the plasma processes. Upper chamber liner 164 is configured to the outer plasma confinement structure 162, and lower chamber liner 166 is configured to line the lower region of the plasma processing chamber wall from the outer plasma confinement structure 162 to the base of the etch chamber 200 and turbopump 202 exhaust.

Embodiments of the present disclosure may be practiced on any plasma facing surfaces shown in FIG. 1A. For illustration, plasma facing surfaces shown in FIG. 1A may include, but is not limited to, chamber liner 164, chamber liner 166, top electrode 142, bottom electrode 144, and components of the confinement assembly 173.

Figure 1B:
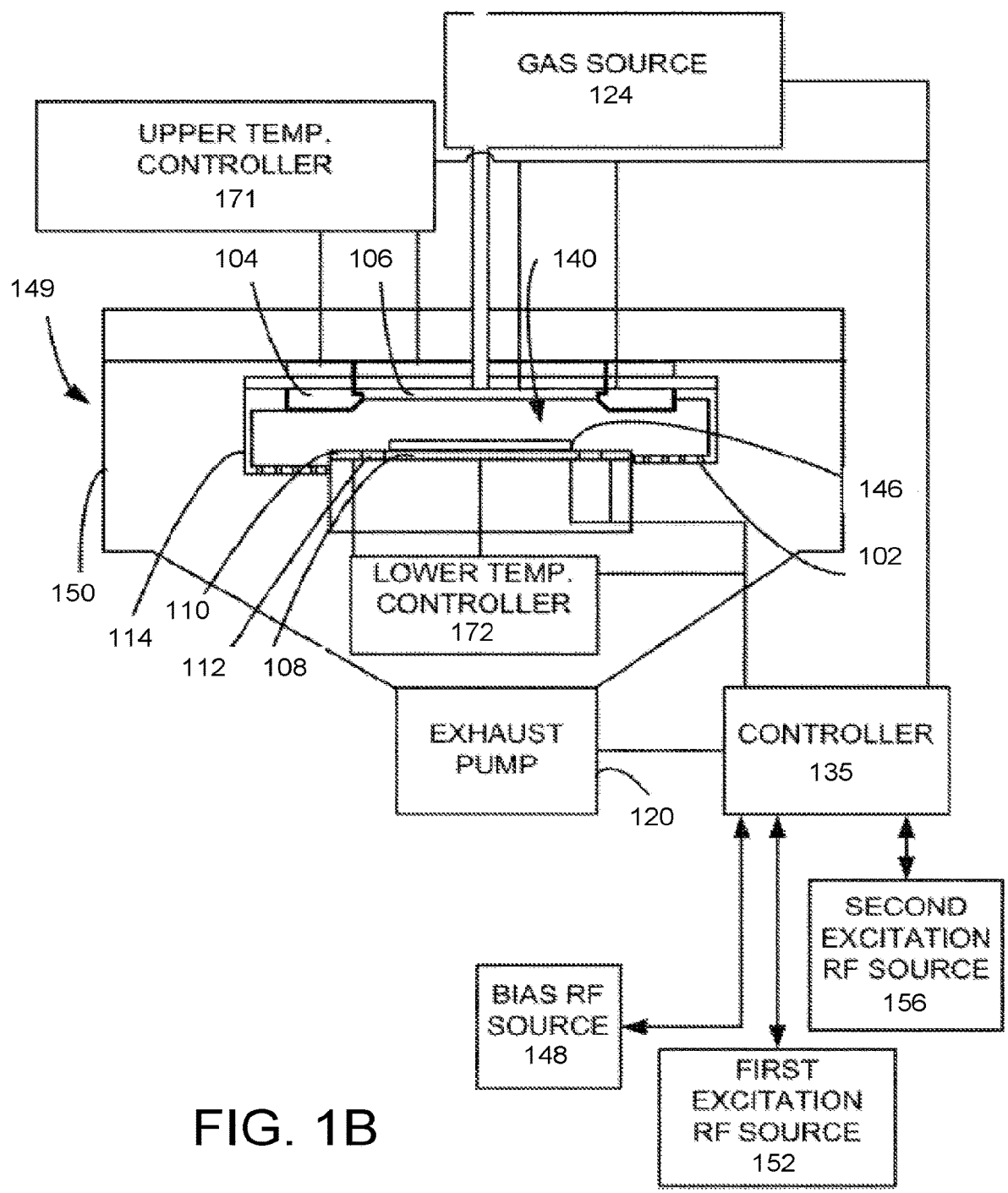
FIG. 1B illustrates another example of an etch chamber that includes at least one consumable part that includes engineered surfaces having macroscopic texturing designed to increase the surface area of a plasma facing surface for better adhesion of additional layers and/or byproducts through additional bonding sites, in accordance with one embodiment of the present disclosure.

FIG. 1B illustrates another example of plasma processing chamber 100B (e.g., etch chamber) that includes at least one consumable part that includes engineered surfaces having macroscopic texturing designed to increase the surface area of a plasma facing surface for better adhesion of additional layers and/or byproducts through additional bonding sites, in accordance with one embodiment of the present disclosure. In particular, plasma processing chamber 100B may include a top central electrode 106, top outer electrode 104, bottom central electrode 108, and a bottom outer electrode 110, within a plasma processing chamber 149, enclosed by a chamber wall 150. A bottom insulator ring 112 insulates the bottom central electrode 108 from the bottom outer electrode 110. Ring 112 may be or may incorporate an edge ring and/or a focus ring. Also within the plasma processing chamber 149, the substrate 146 is positioned on top of the bottom central electrode 108. The bottom central electrode 108 provides an electrostatic chuck (ESC) for holding the substrate 146. In this embodiment the bottom outer electrode 110 and the top outer electrode 104 have apertures that have a larger diameter than the substrate 146, so that the substrate 146 is positioned within the apertures.

A gas source 124 is connected to the plasma processing chamber 149 and supplies the etch gas into a plasma region 140 of the plasma processing chamber 149 during wafer processes (e.g., etch processes). A bias RF source 148, a first excitation RF source 152, and a second excitation RF source 156 are electrically connected to the plasma processing chamber 149 through a controller 135 to provide power to the electrodes 104, 106, 108, and 110. The bias RF source 148 generates bias RF power and supplies the bias RF power to the plasma processing chamber 149. The first excitation RF source 152 generates source RF power and supplies the source RF power to the plasma processing chamber 149. The second excitation RF source 156 generates another source RF power and supplies the source RF power to the plasma processing chamber 149, in addition to the RF power generated by the first excitation RF source 152. The different RF signals may be supplied to various combinations of the top and bottom electrodes. In this example, the top electrodes are grounded and power is only provided to the bottom central electrode 108.

A C-shroud 114 extends from the top outer electrode 104 to the bottom outer electrode 110 to provide additional plasma containment. The C-shroud 114 has a plurality of apertures 102 to allow gas and plasma to flow out of the C-shroud 114. In this embodiment, the C-shroud 114 is grounded.

An upper temperature controller 171 provides independent temperature control to the top central electrode 106 and top outer electrode 104. A lower temperature controller 172 provides independent temperature control to the bottom central electrode 108 and bottom outer electrode 110. In one embodiment the top outer electrode 104 and the C-shroud 114 may be maintained at the same temperature by the same setting of the upper temperature controller 171.

The controller 135 is connected to the gas source 124, the bias RF source 148, the upper temperature controller 171, the lower temperature controller 172, the exhaust pump 120, the first excitation RF source 152, and the second excitation RF source 156. The controller 135 controls the flow of the etch gas into the plasma processing chamber 149, the chamber pressure, as well as the generation of the RF power from the three RF sources 148, 152, 156, the electrodes 104, 106, 108, and 110, and the exhaust pump 120.

The top central electrode 106 also serves as a gas distribution plate, which is connected to the gas source 124, and serves as a gas inlet for gas from the gas source 124. The exhaust pump 120 serves as a gas outlet removing gas, which passes from the top central electrode 106 through the plasma region 140 through apertures 102 to the exhaust pump 120. The exhaust pump 120 may help to control pressure.

Embodiments of the present disclosure may be practiced on any plasma facing surfaces shown in FIG. 1B. For illustration, plasma facing surfaces shown in FIG. 1B may include, but is not limited to, top central electrode 106, top outer electrode 104, bottom central electrode 108, and a bottom outer electrode 110, insulator ring 112, edge ring, focus ring, and electrostatic semiconductor wafer clamping/chucking system (e.g., electrostatic chuck—ESC), C-shroud 114.

Figure 2:
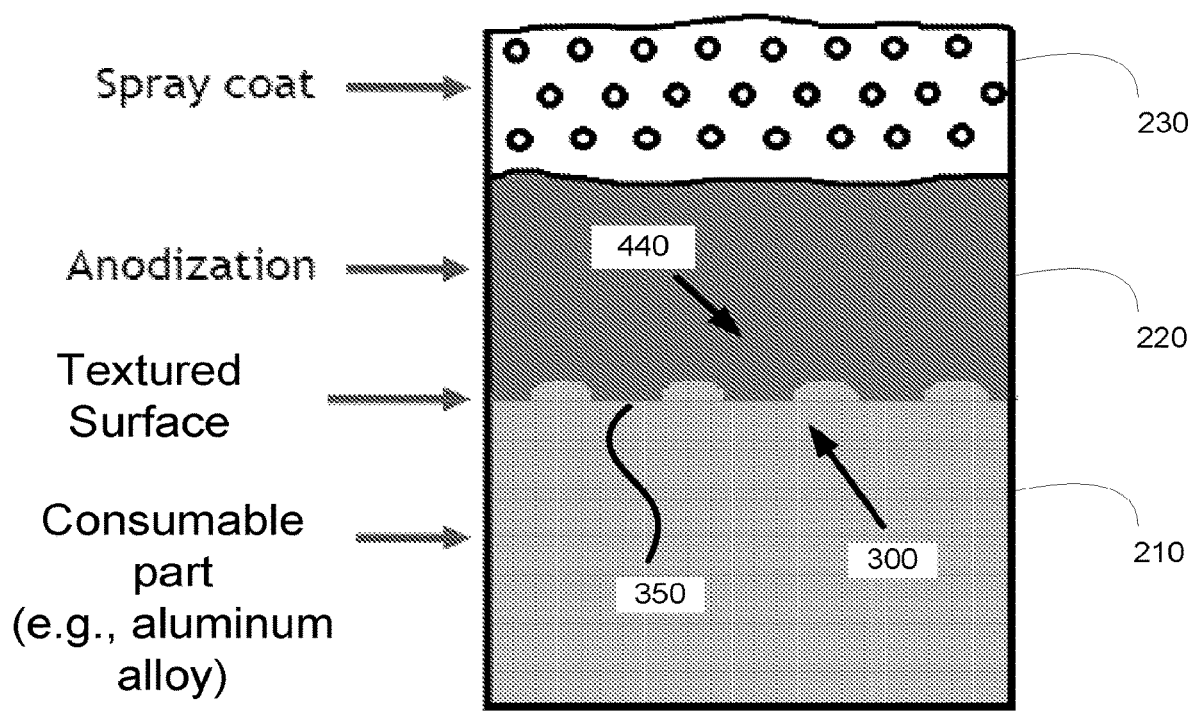
FIG. 2 illustrates a cross-section of a consumable part of a plasma processing system showing an engineered surface having macroscopic texturing designed to create additional bonding sites for better adhesion of additional layers and/or byproducts, in accordance with one embodiment of the present disclosure.

FIG. 2 illustrates a cross-section of a consumable part 210 of a plasma processing chamber showing an engineered surface 300 having macroscopic texturing designed to create additional bonding sites for better adhesion of additional layers and/or byproducts, in accordance with one embodiment of the present disclosure. FIG. 2 is an illustration of an engineered surface 300 that is formed into a plasma facing side of the consumable part 210, wherein the engineered surface 300 includes macroscopic texturing adding patterned, large order-of-magnitude features extending from a base surface 350. The consumable part 210 is configured to be installed in the plasma processing chamber. In one embodiment, the consumable part 210 is removably placed into the plasma processing chamber. More particularly, the consumable part 210 is configured to be exposed to plasma and byproducts of the plasma during wafer processing (e.g., etching, deposition, etc.). In one embodiment, the consumable part 210 is made of a conductive material (e.g., aluminum alloy). In another embodiment, the consumable part is made of a dielectric material (e.g., ceramic).

As shown, the consumable part 210 includes a base surface 350 that includes macroscopic texturing. The base surface 350 that is textured to form the engineered surface 300 along with any other finishing layers may be exposed to plasma during wafer processing. In particular, the macroscopic texturing includes a plurality of raised features 440 defining the engineered surface arranged in a predefined pattern. That is, features in the plurality of raised features 440 are arranged in the predefined pattern, such as over the base surface 350. In embodiments, patterning the base surface 350 of the consumable part for coating adhesion and/or byproduct adhesion is a low-cost, easily executed, and repeatable method. Instead of providing indiscriminate microscopic texturing (e.g., microscopic surface roughening applied through indiscriminate grit blasting) to the base surface 350 of the consumable part 210 to promote adhesion as is performed in the current technology, embodiments of the present disclosure provide for macroscopic texturing of the base surface 350 of the consumable part to form the engineered surface 300, wherein macroscopic features are patterned onto the base surface 350 to promote coat adhesion (e.g., to the base surface and/or to an anodization layer over the base surface) and/or to promote enhanced anchoring of byproducts to the consumable part during wafer processing (e.g., anchoring to the base surface, to an anodized base surface, and/or to a spray coat over the base surface or over the base surface that is anodized). In embodiments, the macroscopic features may be formed through masking and media blasting, machining, wet chemical etching through a stencil or mask, selective deposition methods, additive manufacturing, etc. as will be further described below. The consumable part may be of a plain bulk material (e.g., bare ceramic, bare aluminum, etc.), may be anodized (e.g., anodized aluminum), and may or may not have a plasma spray coat applied, in various embodiments. The intended effects of macroscopic texturing of plasma facing surfaces for consumable parts include enhancing spray coat adhesion (or adhesion of additional layers) and/or byproduct adhesion, in embodiments. For example, byproducts may be formed during etching processes, wherein the byproducts may adhere to one or more components (e.g., plasma confinement liner) of a corresponding plasma processing chamber. As an illustration, macroscopic texturing provides for features that are approximately 5 to 100 times the size of the features provided the previously generated microscopic texturing. In embodiments, the macroscopic features range in size between 0.1 mm to 3.0 mm. In other embodiments, the macroscopic features range in size between 0.2 mm and 2.5 mm. In still other embodiments, the macroscopic features range in size between 0.2 mm and 1.3 mm. In other embodiment, the macroscopic features range in size between 0.3 mm and 1.0 mm.

Further, a plurality of microscopic features may be indiscriminately applied to the plurality of raised features. For example, the plurality of raised features may be roughened through the application of bead and/or grit blasting to build microscopic features into the plurality of raised features. Additional microscopic texturing (e.g., roughening of the macroscopic features) may provide increased fracture resistance of coatings (e.g., better adhesion) that are placed on top of the engineered surface.

The base surface 350 that is patterned with macroscopic features is then optionally anodized to provide an anodization layer 220, in an embodiment. That is the engineered surface 300 is anodized. For example, in one embodiment the consumable part is an aluminum alloy, and the engineered surface 300 is formed from the aluminum alloy. During the anodization process, the aluminum alloy is anodized, such as through an electrolytic passivation process. For example, anodization of metal increases the thickness of natural oxide layer on the surface. In one embodiment, the outline the macroscopic features are exposed through the anodization layer 220, such that the form factor of the macroscopic features is present through the anodization layer. That is, the anodization layer 220 conforms to the contour of the plurality of raised features 440.

In particular, the surface of the anodization layer 220 is altered through the presence and exposure of the macroscopic features. In that manner, the surface area of the base surface 350 of the consumable part, and also the surface area of the anodization layer 220 are increased. That is, the surface morphology of the anodization layer 220 becomes distorted. The combined effect of increased surface area and irregular surface morphology serves to break up internal stresses in the plasma-resistant spray coating 230, therefore improving adhesion of the spray coating 230 to the anodization layer 220. As such, benefits of the macroscopic features exposed through the anodization layer 220 (e.g., exposing the outline) are available to provide better and enhanced adhesion of additional layers through additional bonding sites, etc.

Further, a plasma-resistant, thermal spray-coating 230 is optionally applied to the anodization layer 220, in another embodiment. For example, the spray coating may be a Yttrium based spray-coating (e.g., Yttrium oxide) on the anodized consumable part 210 (e.g., anodized aluminum alloy of the consumable part). The coating 230 may be applied through thermal spraying processes in which heated materials are sprayed onto a surface. In one application, the spray coating is heated through electrical (e.g., plasma or arcing) or chemical (e.g., combustion) processes. In embodiments of the present disclosure, the macroscopic features that define the engineered surface 300 (e.g., formed into base surface 350) enhances the adhesion of the plasma-resistant spray coating 230 to the consumable part 210, and more particularly to the anodization layer 220. That is, the macroscopic features provide better bonding of the plasma-resistant spray coating 230 to the anodization layer 220, which in turn reduces delamination of the plasma-resistant spray coating 230 from the anodization layer 220. Better adhesion of the spray coating 230 prevents on-wafer metal contamination caused by exposure of anodized aluminum through any damaged spray-coating (e.g., delamination).

Figure 3:
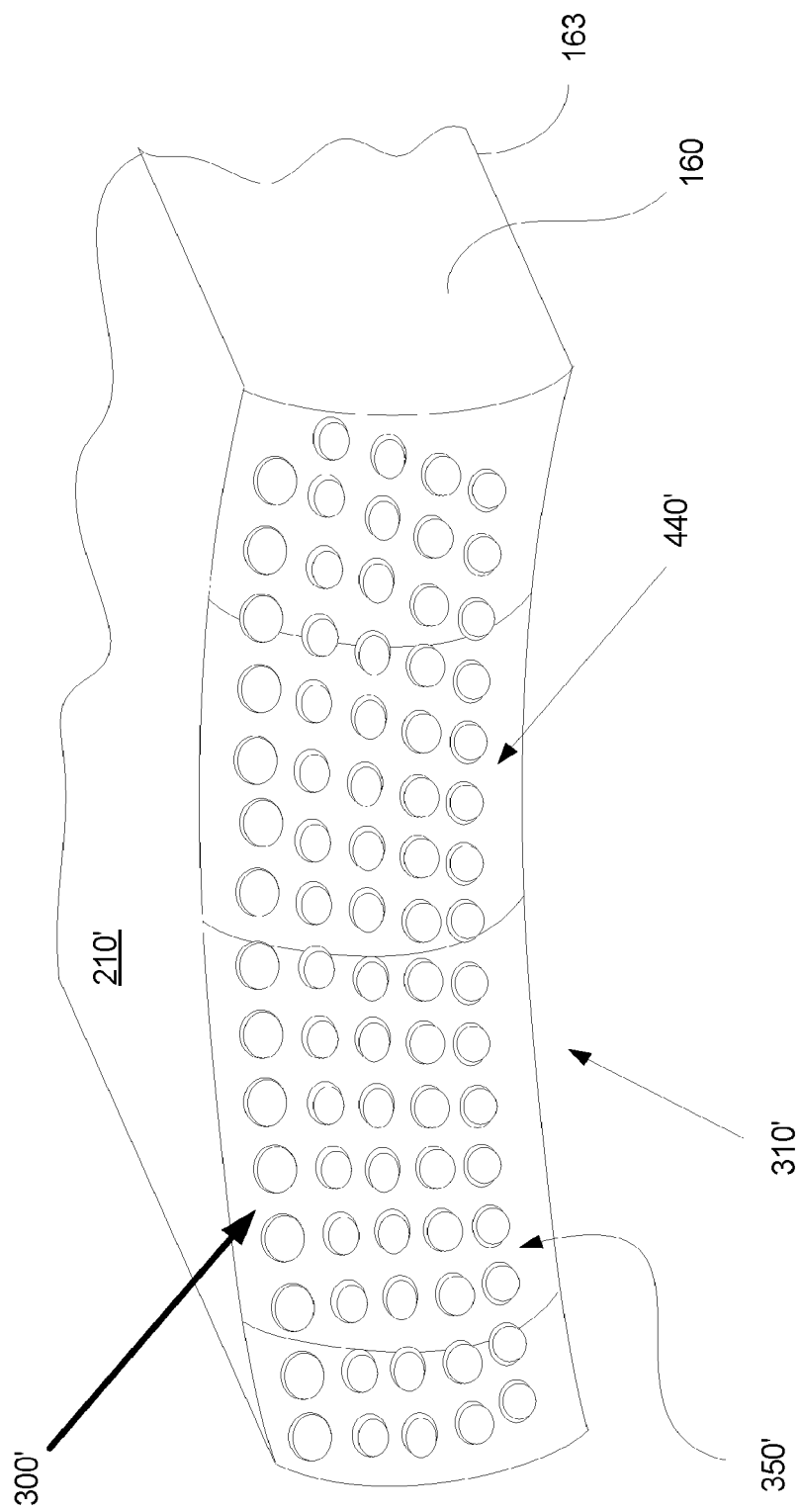
FIG. 3 is an illustration of a plasma confinement ring including an engineered surface having macroscopic texturing designed to create additional bonding sites for better adhesion of additional layers and/or byproducts, in accordance with one embodiment of the present disclosure.

FIG. 3 is an illustration of a consumable part 210' including an engineered surface 300' having macroscopic texturing designed to create additional bonding sites for better adhesion of additional layers and/or byproducts, in accordance with one embodiment of the present disclosure. Purely for illustration, the consumable part 210' may be a plasma confinement ring 160 first introduced in FIG. 1A. For purposes of clarity and illustration, the plasma confinement ring may be used 160 as being representative of a consumable part 210' that is placed into a plasma processing chamber. For example, the consumable part 210' may be removably placed into the plasma processing chamber.

As shown, a plasma facing side 310 of the consumable part 210' includes an engineered surface 300' that includes a plurality of raised features 440', as previously introduced. Each of the plurality of raised feature 440' extends up at an angle from a base surface 350'. For example, the consumable part 210' may be a plasma confinement ring 160 with is configured in the form of a disk (e.g., as shown in FIG. 1A) and includes an inner diameter of the disk or annular ring, wherein the inner diameter defines the plasma facing side 310. In particular, when placed into a plasma processing chamber, the consumable part 210' is exposed to plasma during wafer processing (e.g., during etching, deposition, etc.). More particularly, the plasma facing side 310 may be directly exposed to the plasma within the plasma processing chamber during wafer processing. Embodiments of the present disclosure provide for macroscopic texturing of the plasma facing side 310 of the consumable part 210' to form the engineered surface 300', wherein macroscopic features are patterned onto the surface of the plasma facing side 310 to promote coat adhesion and/or to promote enhanced anchoring of byproducts to the surface of the consumable part during wafer processing.

In addition, the consumable part 210' may include a top portion 169 and a bottom portion 163, such as in a representative plasma confinement ring. Because the top portion 169 and/or the bottom portion 163 may not be directly exposed to plasma, macroscopic texturing of those surfaces may not be necessary in some embodiments. In other embodiments, macroscopic texturing of the top portion 169 and/or bottom portion 163 may be performed because those parts may be indirectly exposed to plasma thereby shortening the lifetime of the consumable part 210' and/or increasing byproduct capture and possible detachment. In those cases, macroscopic texturing of the top portion 169 and/or bottom portion 163 may help to increase the lifetime of any additional plasma-resistant spray coating (not shown) applied to the consumable part 210' (e.g., plasma confinement ring 160) and/or to provide for better adhesion of byproducts to those surfaces and prevent byproduct detachment during one or more wafer processing operations.

In one embodiment, the plurality of raised features may be formed surrounding voids. As an illustration, holes (e.g., circular holes) may be formed in the plasma facing side of the consumable part, wherein the surrounding structures around the holes may be defined as the plurality of raised features. For example, an inverse stencil (e.g., a negative of the stencil used to form the engineered surface of FIG. 3) may be used with media blasting (e.g., grit blasting, bead blasting, etc.) to form the holes and the raised features surrounding the holes.

In another embodiment, a plurality of lowered features defines the engineered surface. For example, an inverse stencil (e.g., a negative of the stencil used to form the engineered surface of FIG. 3) may be used with media blasting (e.g., grit blasting, bead blasting, etc.) to form the plurality of lowered features, wherein a lowered feature may be a void (i.e., opposite a raised feature that is solid). As an illustration, opposite to FIG. 3, a lowered feature may extend downwards at an angle from a base surface.

Figure 4A:
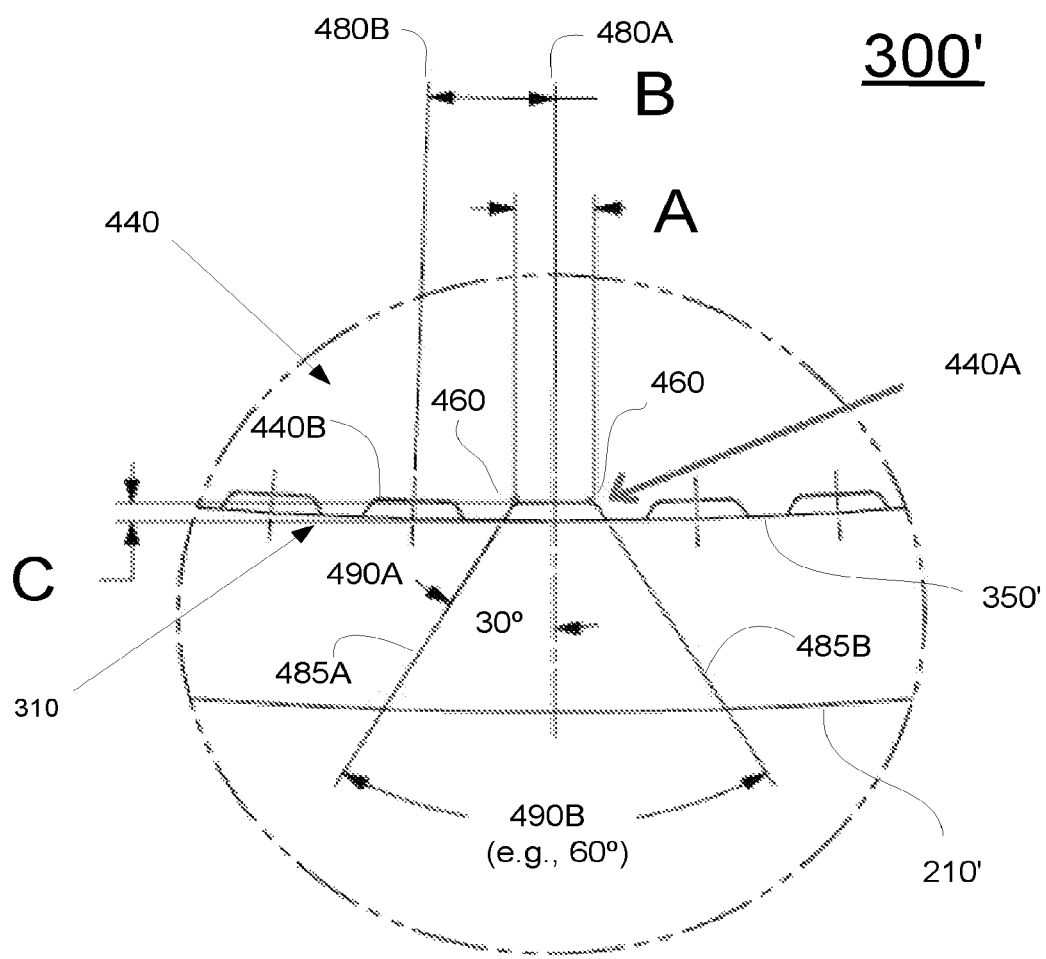
FIG. 4A is a cross-sectional diagram of an engineered surface of a consumable part having macroscopic texturing in the form of raised features that are designed to create additional bonding sites for better adhesion of additional layers and/or byproducts, in accordance with one embodiment of the present disclosure.
Figure 4B:
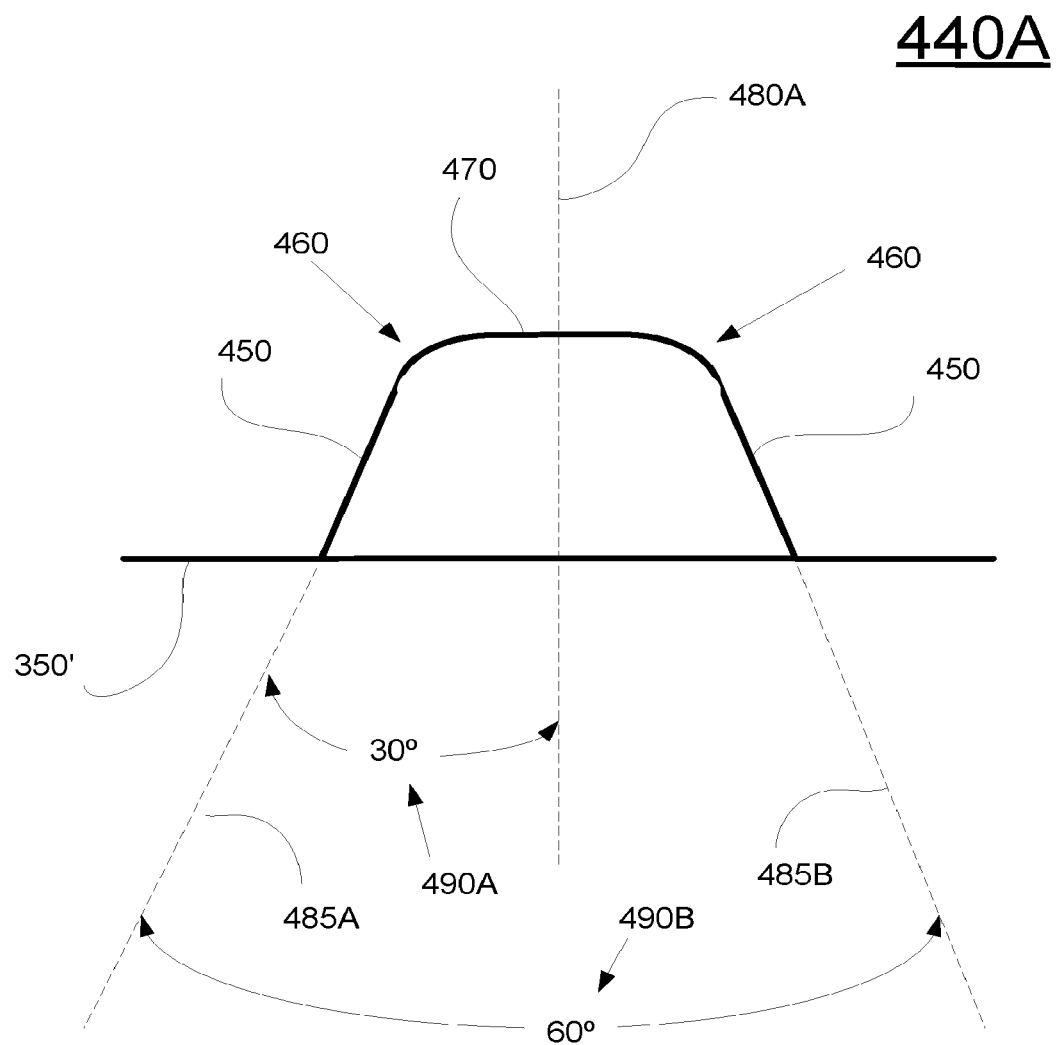
FIG. 4B is a cross-section of a raised feature of an engineered surface having macroscopic texturing designed to create additional bonding sites for better adhesion of additional layers and/or byproducts, in accordance with one embodiment of the present disclosure.

FIGS. 4A-4B illustrate the macroscopic texturing of a surface of a consumable part 210', and includes exemplary dimensions and configurations of each of the features defining the macroscopic texturing, in accordance with embodiments of the present disclosure. For example, FIGS. 4A-4B may be a close up of one or more raised features shown in FIG. 3. In particular, FIG. 4A is a cross-sectional diagram of an engineered surface 300' of a consumable part 210' having macroscopic texturing in the form of a plurality of raised features 440' that are designed to create additional bonding sites for better adhesion of additional layers and/or byproducts, in accordance with one embodiment of the present disclosure. FIG. 4B is a cross-section of a raised feature 440A of the engineered surface 300' having macroscopic texturing designed to create additional bonding sites for better adhesion of additional layers and/or byproducts, in accordance with one embodiment of the present disclosure. FIGS. 4A-4B illustrate various parameters that are controllable when forming the plurality of raised features 440', including center spacing, aspect ratio, feature separation (e.g., distance between features in the pattern), edge finishing (e.g., rounding), etc.

A plasma facing side 310 of the consumable part 210' includes an engineered surface 300'. As previously described, the consumable part 210' may be removably placed into a plasma processing chamber. For example, the consumable part 210' may be a liner configured to protect an inner wall of the plasma processing chamber; or one or more portions of a C-shroud; or one or more portions of a plasma confinement ring; or a focus ring; or an edge ring; or an electrostatic semiconductor wafer clamping/chucking system; or an upper electrode; or a bottom electrode; or a dielectric window for inductively coupled plasmas, etc. The plasma facing side 310 of the consumable part 210' may be a conductive material or a dielectric material in embodiments.

More particularly, a plurality of raised features 440' defines the engineered surface 300'. The plurality of raised features 440' defines the macroscopic texturing formed in the plasma facing side 310 of the consumable part 210'. The plurality of raised features 440' is designed to create additional bonding sites for better adhesion of additional layers and/or capture of byproducts formed during wafer processing. The plurality of raised features 440' is formed in a predefined pattern onto the plasma facing side 310. As shown, a base surface 350' surrounds each of the plurality of raised features 440', such that a corresponding sidewall 450 of a corresponding raised feature 440A extends up from the base surface 350' to a corresponding top region 470. For example, in the cross-section of FIG. 4A, the plurality of raised features 440' includes raised feature 440A, raised feature 440B to the left of feature 440A, and other raised features. Still other raised feature extending into and out of the page of FIG. 4A are not shown.

Raised feature 440A is defined by a center axis 480A, and raised feature 440B is defined by center axis 480B. Distance "B" is defined between the two center axis 480A and 480B, wherein distance B defines the separation between raised features. Additional separations may be defined between raised features depending on the pattern selected for the plurality of raised features formed into the plasma facing side 310 of the consumable part 210'. Purely for illustration, distance B may be about 47 mm. In some embodiments, distance B ranges between about 15 mm to about 75 mm, or greater. In some embodiments, distance B ranges between about 10 mm and about 60 mm. In some embodiments, distance B ranges between about 20 mm and about 50 mm.

Each of the raised features includes a top region and sidewall. The raised features may be described as a nodule, or truncated cone, in some embodiments. As a representation of raised features, raised feature 440A includes a top region 470 (e.g., plateau). The top region 470 may have an outer edge 460. In one embodiment, the outer edge 460 is a rounded corner. In another embodiment, the outer edge 460 is not rounded, i.e., left sharp. For purposes of illustration, outer edge 460 is described throughout the specification as being a rounded corner, but could be defined by other features, such as being a sharp corner, etc. Each of the raised features may have a predefined edge finish for corresponding outer edges. In one embodiment, the edge finish may include a rounded corner at the outer edge, such as for raised feature 440A. In another embodiment, the edge finish may be sharp and/or distinct. Other types of edge finishes are supported and their formations are controlled through application of bead and/or grit blasting through a stencil onto the plasma facing side 310. For example, edge finishes to the outer edge may include a beveled edge, an overall mounded shape to the top region, sharp edge, etc. Distance "A" defines the distance between rounded corners on opposing sides of top region 470. Purely for illustration, distance A may be about 2 mm, wherein distance A may be a diameter of the top region 470. In some embodiments, distance A ranges between about 0.5 mm to about 5 mm. In other embodiments, distance A ranges between about 1 mm and about 4 mm. In still other embodiments, distance A ranges between about 1.5 mm and about 3 mm.

For the representative raised feature 440A, distance "C" defines the height of the feature. Purely for illustration, distance C may be about 0.5 mm. In some embodiments, distance C ranges between about 0.1 mm to about 3.0 mm. In some embodiments, the distance C ranges between about 0.2 mm and about 3 mm. In other embodiments, the distance C ranges in size between about 0.2 mm and about 2.5 mm. In still other embodiments, the macroscopic features range in size between about 0.2 mm and about 1.3 mm. In other embodiment, the macroscopic features range in size between about 0.3 mm and about 1.0 mm.

In addition, representative raised feature 440A, may include a sidewall 450. Raised feature 440A extends up at an angle from base surface 350'. In particular, sidewall 450 extends up at an angle 490A from base surface 350', wherein angle 490A is defined between line 485A (extending from sidewall 450) and center axis 480A. The configurations of the sidewall 450 and top region 470 define an aspect ratio (ratio between the approximate height and approximate diameter of the raised feature 440A at the base surface 350') that is controllable through application of grit and/or bead blasting through a stencil onto the plasma facing side of the consumable part. Purely for illustration, angle 490A is about 30 degrees. In embodiments, angle 490A ranges between about 15 to about 60 degrees. In some embodiments, angle 490A ranges between about 0 to about 45 degrees. In other embodiments, angle 490A ranges between about 15 and about 40 degrees. In other embodiments, angle 490A ranges between about 20 and about 40 degrees. In still other embodiments, angle 490A ranges between about 25 and about 35 degrees. In addition, angle 490B is defined between opposing sides shown by lines 485A and 485B extending down from sidewall 450. For example, angle 490B is about 60 degrees. In some embodiments, angle 490B ranges between 0 to 90 degrees. In other embodiments, angle 490A ranges between about 30 and about 80 degrees. In other embodiments, angle 490A ranges between about 40 and about 80 degrees. In still other embodiments, angle 490A ranges between about 50 and about 70 degrees. Purely for illustration, the angles 490A and 490B defining sidewall 450 and the top region 470 may form a nodule or truncated cone.

Figure 5:
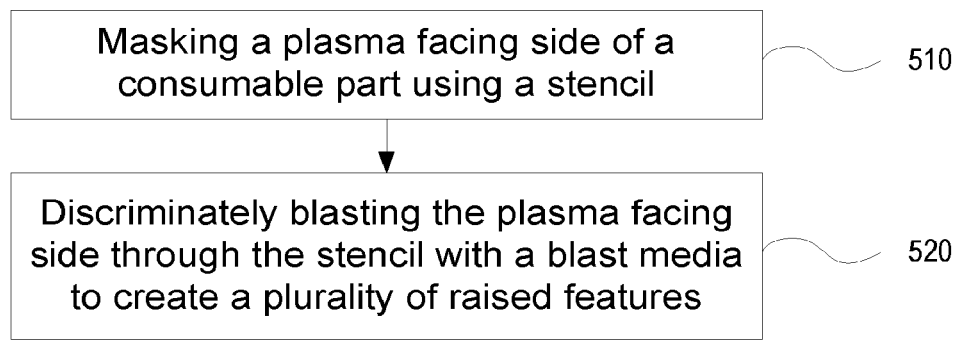
FIG. 5 is a flow diagram illustrating a method for building an engineered surface of a consumable part having macroscopic texturing in the form of raised features that are designed to create additional bonding sites for better adhesion of additional layers and/or byproducts, in accordance with one embodiment of the present disclosure.

FIG. 5 is a flow diagram 500 illustrating a method for building an engineered surface of a consumable part having macroscopic texturing in the form of raised features that are designed to create additional bonding sites for better adhesion of additional layers, in accordance with one embodiment of the present disclosure. Flow diagram 500 may be implemented to create and/or build any of the macroscopic features defining engineered surfaces of plasma facing sides of consumable parts described in this application in FIGS. 1-4 and 6-11. Flow diagram 500 illustrates one method for patterning the macroscopic texturing (e.g., features) defining the engineered surface of the consumable part is accomplished through masking and media blasting. Other embodiments may form the macroscopic texturing (e.g., features) defining the engineered surface through machining (e.g., via physical or laser ablation, etc.). Still other embodiments may form the macroscopic texturing (e.g., features) defining the engineered surface through wet chemical etching through a stencil or mask, or selective deposition, or additive manufacturing to deposit features that create the desired engineered surface (e.g., through powder bed fusion, material extrusion, direct deposition, etc.), etc.

At 510, the method includes masking a plasma facing side of the consumable part using a stencil, wherein the stencil includes a pattern of openings providing access to the plasma facing side. The plasma facing side of the consumable part may comprise a conductive material (e.g., aluminum alloy, aluminum, metal, etc.) or a dielectric material (e.g., ceramic). The plasma facing side of the consumable part is configured to be exposed to a plasma and byproducts of the plasma. As previously described, macroscopic features are patterned onto the plasma facing side of the consumable part to promote coat adhesion, such as enhanced adhesion of a plasma-resistant spray coating. In one implementation, the macroscopic features may be formed in the conductive material (e.g., aluminum alloy) taken immediately after machining.

The stencil is used to control the formation of the macroscopic features (e.g., the plurality of raised features). In particular, the form, shape, and/or outline of each of the macroscopic features are controlled by the stencil that is placed over the plasma facing side during blasting. In addition, the pattern (including sub-patterns) of the plurality of raised features as formed in the plasma facing side, and defining the engineered surface of the plasma facing side, is controlled through the stencil during blasting. Control parameters defining the formation of the raised features include, but are not limited to, overall shape, center spacing, aspect ratio, feature separation (e.g., distance between features in the pattern), edge finishing (e.g., rounding), etc.

In embodiments, the stencil may be of any suitable material. In particular, the stencil can be made of any material that may not deform under media blasting. In one embodiment, the stencil is made of a material that cannot deform during media blasting. In other embodiments, the stencil may be made of a material that allows the stencil to be reusable. In other embodiments, the stencil is disposable.

In still other embodiments, the stencil is made of material that can conform to complicated part geometries, including transitions between edges (e.g., corners, etc.) of the surface of a corresponding consumable part (e.g., chamber liners, etc.), conductance gaps, transitions between surfaces of a consumable part, etc. That is, the plasma facing side of the consumable part includes surface transitions (e.g., edges, corners, valleys, etc.) that may contribute to delamination of coatings that are later applied. For example, delamination may occur more frequently at a corner of a consumable part that is not modified with embodiments of the present disclosure. The addition of macroscopic features to the plasma facing side enhances the ability of the coatings to adhere more firmly to the plasma facing side having surface transitions, in embodiments.

At 520, the method includes discriminately blasting the plasma facing side through the stencil with a blast media to create a plurality of raised features defining the engineered surface, the engineered surface being formed into the plasma facing side. In one embodiment, the macroscopic features are applied by means of grit-media blasting through a fabricated stencil. In another embodiment, the macroscopic features are applied through photo-masking and etching. The features of the plurality of raised features are arranged in a predefined pattern over the engineered surface. In addition, each of the plurality of raised features includes a top region having an outer edge and a sidewall, in one embodiment. In one embodiment, the outer edge is rounded. In other embodiments, the outer edge is not rounded, and could be defined as having a sharp edge or corner. A base surface of the engineered surface surrounds each of the plurality of raised features, such that a corresponding sidewall of a corresponding raised feature extends up at an angle from the base surface to a corresponding top region.

Macroscopic patterns can be created by the following methods, but not limited to bead blasting using a media, grit blasting using a media, and photo masking with etching. In one embodiment, the macroscopic patterns are formed through application of bead blasting using beads as the blasting media. In another embodiment, the macroscopic patterns are formed through application of grit blasting using grit material as the blasting media. Control parameters during bead blasting and/or grit blasting include type of media, size of the media, duration of blasting, direction of blasting, number of passes, etc. In one embodiment, the media used in bead blasting or grit blasting is formed of the same composition and/or material used for forming the plasma facing side of the consumable part to reduce and/or prevent contamination of the plasma facing side due to blast media impregnation onto the plasma facing side. In still other embodiments, the macroscopic patterns are formed through photo-masking and etching. For example, the etching process includes wet chemical etching, plasma etching, etc. In other embodiments, the patterned macroscopic features are formed through machining, selective deposition methods, additive manufacturing, etc.

Additional finishing steps are performed on the macroscopically textured plasma facing side of the consumable part. For example, the method may include removing the stencil, and indiscriminately blasting the plasma facing side with a second blast media to roughen the plurality of raised features with microscopic features, in one embodiment. Microscopic texturing is performed on the plurality of raised features to provide increased fracture resistance of coatings placed on top of the engineered surface. In other embodiments, additional finishing steps may include anodizing the engineered surface, such as to build and/or generate an anodization layer. In addition, a thermal spray coating (e.g., plasm-resistant spray-coating) may be applied to the anodized engineered surface, as an additional finishing step. In particular, at least some of the plurality of raised features are prominent through the anodization layer to enhance adhesion of the thermal spray coat to the anodization layer.

In one embodiment, the formation of the macroscopic features (e.g., plurality of raised features, plurality of lowered features, etc.) may be formed through wet chemical etching through a stencil or a mask. For example, the consumable part could be masked using adhesive tape that would lead to selective chemical etching of the exposed surface, which results in deliberate feature formation.

In another embodiment, the formation of the macroscopic features (e.g., plurality of raised features, plurality of lowered features, etc.) may be formed through selective deposition methods. The raised features may be created by selectively activating targeted areas of interest using wet chemistry or dry chemistry such as plasma, then followed by deposition of the desired material in the areas that are activated. The raised features can also be created using an inverse method, that is, through passivating the areas for lowered features such that subsequent deposition is favored in the rest of the areas.

In yet another embodiment, the formation of the macroscopic features (e.g., plurality of raised features, plurality of lowered features, etc.) may be formed through additive manufacturing. The added material may be composed of the same material or of a different composition than the underlying plasma facing side of the consumable part. In addition, the added material may have the same or different microstructure as that of the underlying plasma facing side of the consumable part. For example, methods of additive manufacturing may include for purposes of illustration, but is not limited to, photopolymerization, powder bed fusion, material extrusion, direct deposition, etc.

In still another embodiment, a plurality of lowered features defines the engineered surface. For example, an inverse stencil or mask may be used with media blasting (e.g., grit blasting, bead blasting, etc.) to form the plurality of lowered features. When using an inverse stencil, a lowered feature may be created that is a void in the engineered surface (i.e., opposite a raised feature that is solid). In another embodiment, an inverse stencil or mask may be used with chemical etching to form the plurality of lowered features.

FIGS. 6A, 6B-1, 6B-2, and 6C illustrate the process of grit or bead blasting through a stencil to build an engineered surface 300' of a consumable part 210' having macroscopic texturing. In particular, macroscopic features (e.g., raised features) are patterned onto a plasma facing side 310 (e.g., surface) of a consumable part 210' to promote coat and/or byproduct adhesion.

Figure 6A:
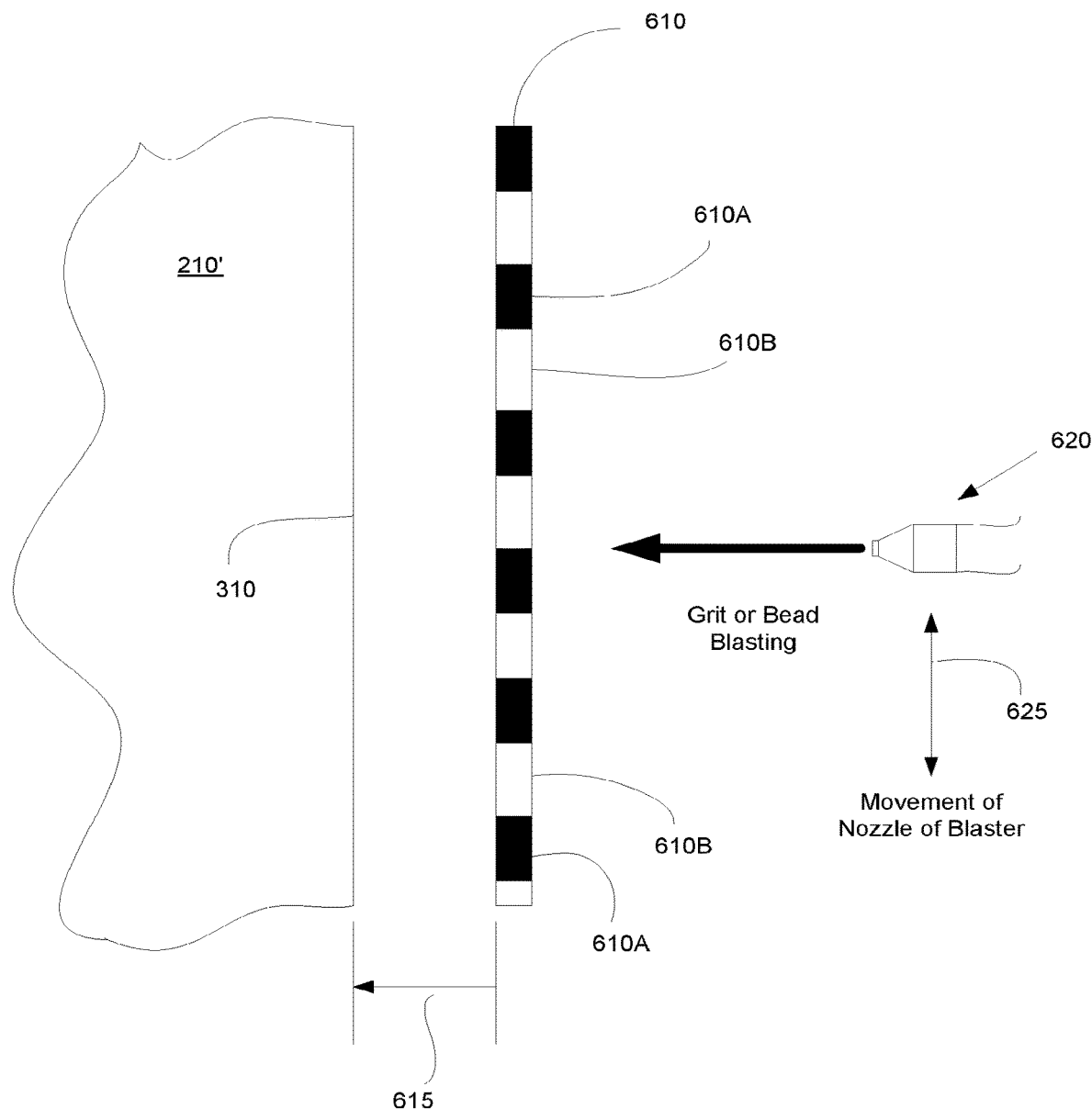
FIG. 6A illustrates the process of grit or bead blasting through a stencil to build an engineered surface of a consumable part having macroscopic texturing in the form of raised features that are designed to create additional bonding sites for better adhesion of additional layers and/or byproducts, in accordance with one embodiment of the present disclosure.

In particular, FIG. 6A illustrates the process of grit or bead blasting through a stencil to build an engineered surface 300' of a consumable part 210' having macroscopic texturing in the form of raised features that are designed to create additional bonding sites for better adhesion of additional layers and/or byproducts, in accordance with one embodiment of the present disclosure. As is shown in FIG. 6A, the plurality of raised features is applied by means of grit-media blasting through a fabricated stencil 610, in one embodiment. For example, stencil 610 includes openings 610A through which the blast media may traverse and reach the plasma facing side 310 of the consumable part 210'. In addition, stencil 610 includes blockages 610B where the blast media is blocked from reaching the plasma facing side 310 of the consumable part 210'. In that manner, the stencil 610 controls the formation of the plurality of raised features onto the plasma facing side 310 of the consumable part, wherein the plurality of raised features defines the corresponding engineered surface of the consumable part 210'.

As shown in FIG. 6A, distance 615 shows the distance between the stencil 610 and the plasma facing side 310 (e.g., surface of the plasm facing side). In some applications, the distance 615 is minimized until the stencil 615 is resting on the plasma facing side 310 during bead and/or grit blasting. In other embodiments, the stencil 615 is off of the plasma facing side 310 (e.g., distance 615 has a value) during bead and/or grit blasting.

Blaster nozzle 620 is configured to deliver the blasting media (e.g., grit and/or bead) at one or more angles through the stencil to the plasma facing side 310 of the consumable part 210'. In some implementations, the blaster nozzle 620 is moved across the stencil in a pattern. For example, the blaster nozzle 610 may move in one or more directions in a first cycle or pass. For purposes of illustration, the blaster nozzle 610 may move in one direction across the stencil (e.g., vertical or lateral, or diagonal) for a cycle or pass. One or more cycles or passes may be performed during the bead and/or grit blasting process. Different patterns of the movement of the blaster nozzle 620 may also be performed when building the plurality of raised features in the plasma facing side 310 of the consumable part 210'.

Figures 1, 6B:
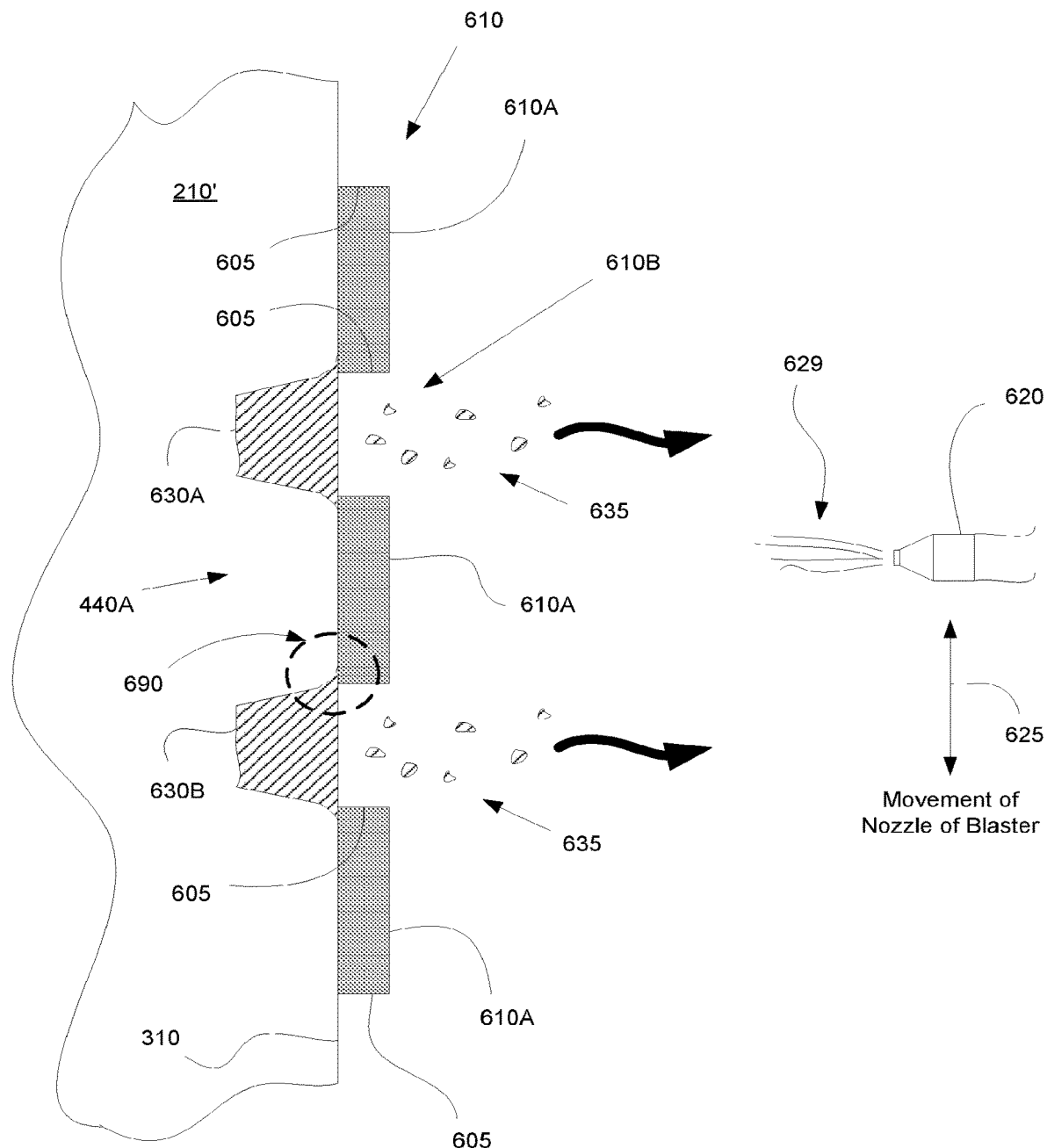
FIG. 6B-1 illustrates the application of grit or bead blasting at one angle to a plasma facing side of a consumable part to build an engineered surface having macroscopic texturing in the form of raised features that are designed to create additional bonding sites for better adhesion of additional layers and/or byproducts, in accordance with one embodiment of the present disclosure.
Figures 2, 6B:
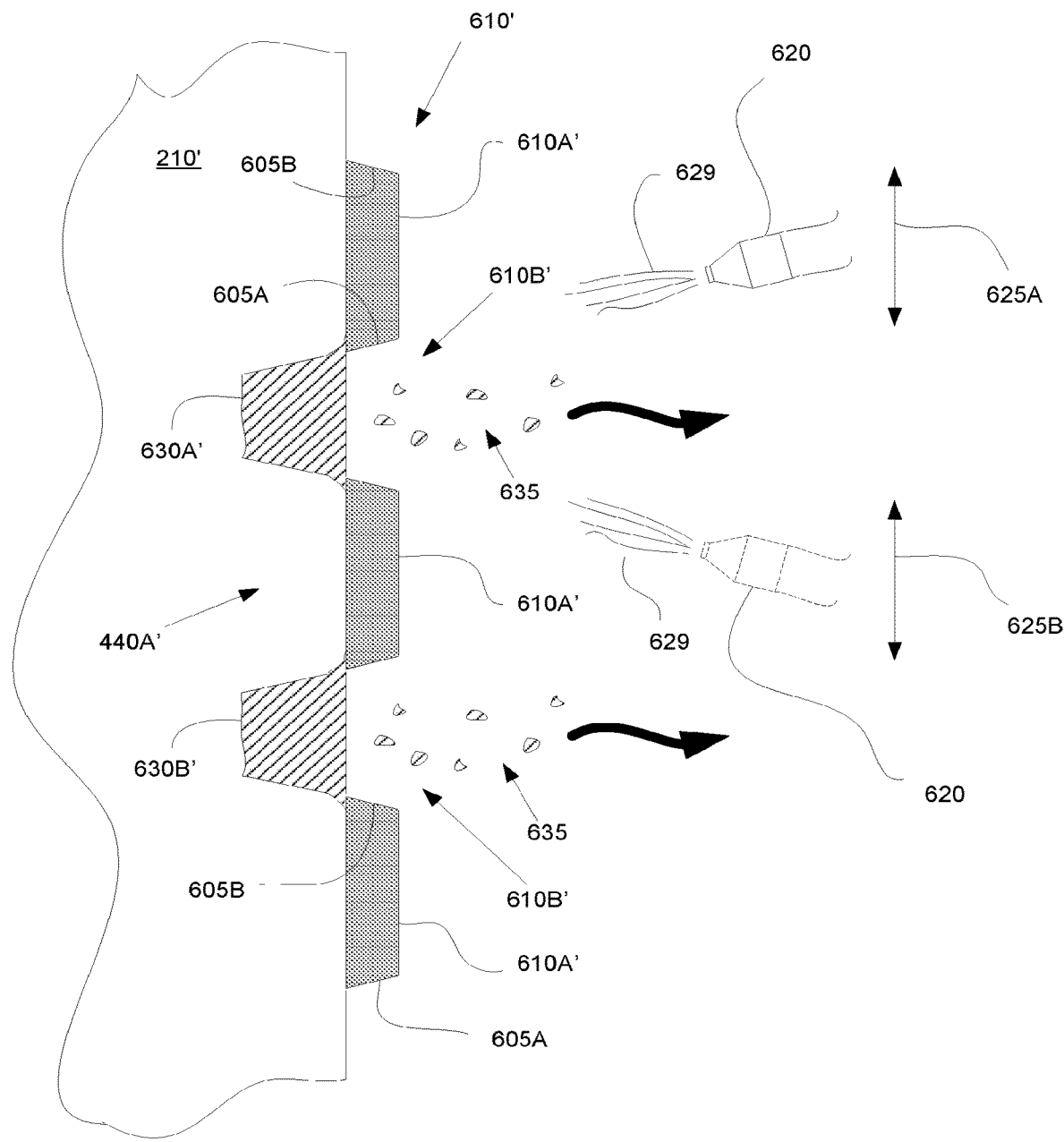

FIG. 6B-1 illustrates the application of grit or bead blasting at one angle to a plasma facing side 310 of a consumable part 210' shown in FIG. 6A to build an engineered surface 300' having macroscopic texturing in the form of raised features that are designed to create additional bonding sites for better adhesion of additional layers and/or byproducts, in accordance with one embodiment of the present disclosure. In particular, macroscopic features (e.g., raised features) are patterned onto a plasma facing side 310 (e.g., surface) of a consumable part 210' to promote coat and/or byproduct adhesion.

As shown in FIG. 6B-1, stencil 610 is placed against the plasma facing side 310 of the consumable part 210' during bead and/or grit media blasting. Stencil 610 includes openings 610B through which blast media 629 is able to reach the plasma facing side 310 when blasted from the baster nozzle 620. Stencil 610 includes blockages 610A which restrict blast media 629 from passing and reaching the plasma facing side 310 of the consumable part 210'. As previously described, blaster nozzle 620 may move across the stencil in a predefined or random pattern, such as in a prescribed movement 625.

During the application of bead and/or grit blasting, particulates 635 are removed from the consumable part 210'. In particular, the blast media strikes and/or impacts the plasma facing side 310 and removes portions (e.g., material) of the consumable part 210' as particulates 635. For example, regions 630A and 630B are removed from the consumable part 210' on opposing sides of the raised feature 440A. In one implementation, the regions 630A and 630B join together to surround the raised feature 440A. The particulates 635 may include blast media 629.

Highlight 690 of an outer edge of the raised feature 440A shows the undercutting of material from the consumable part 210' beneath a blockage 610 of the stencil 610. In particular, highlight 690 illustrates the formation of the rounded corners of the outer edge of the top region of the raised feature 440A in one embodiment, as the blast media removes material from the plasma facing side 310 of the consumable part 210' underneath the blockage 610A.

FIG. 6B-2 illustrates the application of grit or bead blasting at multiple angles to a plasma facing side 310 of a consumable part 210' to build an engineered surface 300' having macroscopic texturing in the form of raised features that are designed to create additional bonding sites for better adhesion of additional layers and/or byproducts, in accordance with one embodiment of the present disclosure. In particular, macroscopic features (e.g., raised features) are patterned onto a plasma facing side 310 (e.g., surface) of the consumable part 210' to promote coat and/or byproduct adhesion.

As shown in FIG. 6B-2, stencil 610' is placed against the plasma facing side 310 of the consumable part 210' during bead and/or grit media blasting. Stencil 610' includes openings 610B' through which blast media 629 is able to reach the plasma facing side 310 when blasted from the baster nozzle 620. Stencil 610' includes blockages 610A' which restrict blast media 629 from passing and reaching the plasma facing side 310 of the consumable part 210'. Each of the blockages 610A includes at least one angled side 605. For example, a corresponding blockage 610A may include angled sides 605A and 605B.

As previously described, blaster nozzle 620 may move across the stencil in a predefined or random pattern, such as in a prescribed movements 625A and/or 625B. During the application of bead and/or grit blasting, particulates 635 are removed from the consumable part 210'. In particular, the blast media strikes and/or impacts the plasma facing side 310 and removes portions (e.g., material) of the consumable part 210' as particulates 635. For example, regions 630A' and 630B' are removed from the consumable part 210' on opposing sides of the raised feature 440A'. In one implementation, the regions 630A' and 630B' join together to surround the raised feature 440A'. The particulates 635 may include blast media 629.

For example, in one pass, the blaster nozzle 620 may move in one direction, and in another pass blaster nozzle 620 may move in an opposite direction. In another implementation, the blaster nozzle 620 follows a prescribed movement 625A in the pattern with the nozzle at a first angle with respect to the plasma facing side 310. In particular, at the first angle, the delivery of the blast media 629 is aligned with angled side 605A of the corresponding blockage 610A, such that the blast media 629 is able to undercut the corresponding blockage 610A to form the rounded corners of the outer edge of the top region of the corresponding raised feature 440A, in one embodiment. In another implementation, the blaster nozzle 620 follows a prescribed movement 625B in the pattern with the nozzle at a second angle with respect to the plasma facing side 310. In particular, at the second angle, the delivery of the blast media 629 is aligned with angled side 605B of the corresponding blockage 610A, such that the blast media 629 is able to undercut the corresponding blockage 610A to form the rounded corners of the outer edge of the top region of the corresponding raised feature 440A, in one embodiment.

Figure 6C:
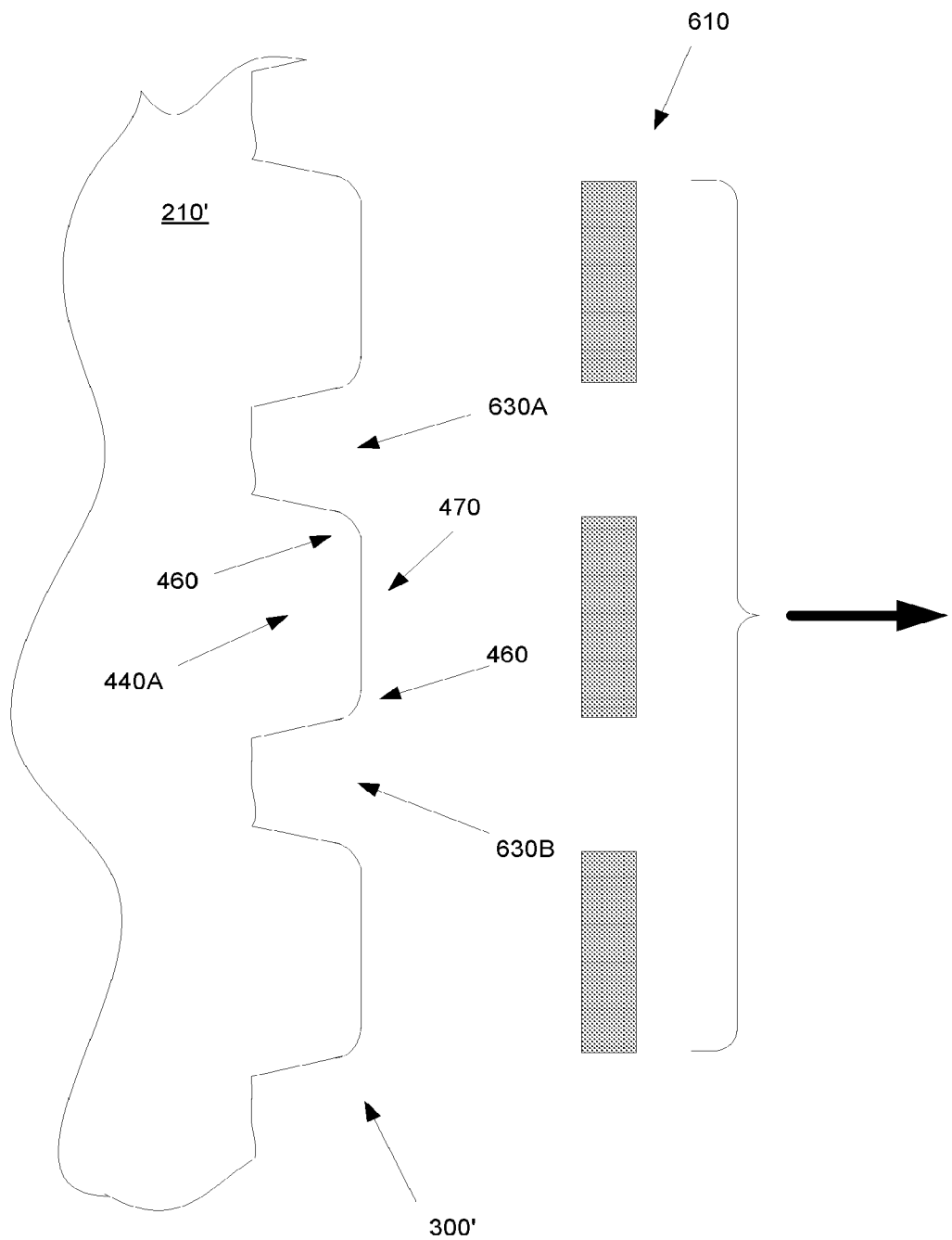
FIG. 6C illustrates an engineered surface of a consumable part after application of grit or bead blasting, wherein the engineered surface includes macroscopic texturing in the form of raised features that are designed to create additional bonding sites for better adhesion of additional layers and/or byproducts, in accordance with one embodiment of the present disclosure.

FIG. 6C illustrates an engineered surface 300' of the consumable part 210' after application of grit or bead blasting as shown in FIGS. 6A, 6B-1 and/or 6B-2, wherein the engineered surface 300' includes macroscopic texturing in the form of a plurality of raised features 440' (including raised feature 440A) that are designed to create additional bonding sites for better adhesion of additional layers, in accordance with one embodiment of the present disclosure.

In particular, after the macroscopic features are created in the plasma facing side 310 of the consumable part 210', the stencil 610 is removed from the plasma facing side 310 to reveal the plurality of raised features defining the engineered surface 300'. In particular, the macroscopic features may be represented by raised feature 440A, which was previously described in relation to FIGS. 4A-4B. For example, raised feature 440A includes a top region 470, which may have an outer edge, and sidewalls extending up at an angle from the base surface 350' of the engineered surface 300'. Empty regions 630A and 630B may join to surround raised region 440A. As shown in FIG. 6C, the outer edge 460 of raised feature 440A is rounded, in one embodiment. Each of the raised features may have a predefined edge finish for corresponding outer edges, as previously described. In one embodiment, the edge finish may include a rounded corner at the outer edge, such as for raised feature 440A. In other embodiments, the edge finish may include a sharp corner at the outer edge.

In one embodiment, after macroscopic features are created, the stencil is removed, and the entire engineered surface 300' is subjected to grit and/or bead blasting to create indiscriminate microscopic roughening. Thereafter, the engineered surface 300' of the consumable part 210' undergoes anodization and top-layer coating (e.g., plasma-resistant spray-coating) finishing. The plasma-resistant spray-coating can be applied via plasma spray, thermal spray, CVD, or other available techniques.

Figure 7A:
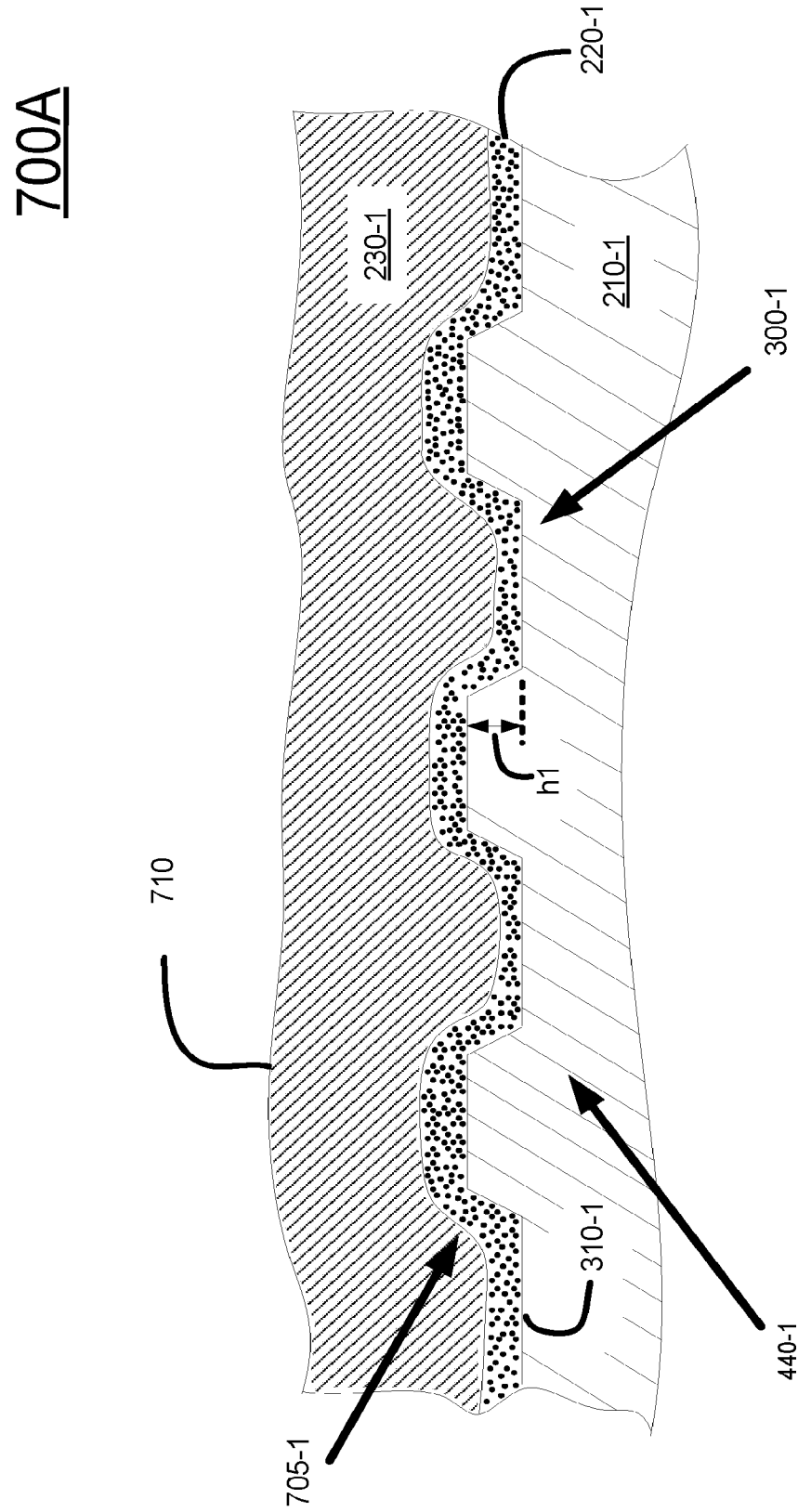
FIG. 7A illustrates a consumable part including an engineered surface that has been anodized and covered with a plasma-resistant spray-coat having a relatively flat surface exposed to plasma within a plasma processing system, the spray-coat not conforming to an engineered surface having macroscopic texturing in the form of raised features that are designed to create additional bonding sites for better adhesion of additional layers and/or byproducts, in accordance with one embodiment of the present disclosure.

FIG. 7A illustrates a consumable part 210-1 including an engineered surface 300-1 that has been anodized (e.g., anodization layer 220-1) and covered with a plasma-resistant spray-coat 230-1 that does not conform to an engineered surface 300-1 having macroscopic texturing in the form of raised features that are designed to create additional bonding sites for better adhesion of additional layers, in accordance with one embodiment of the present disclosure.

In particular, the plurality of raised features 440-1 is formed onto a plasma facing side 310-1 of a consumable part 210-1. The plurality of raised features 440-1 defines the engineered surface 300-1. In addition, the plurality of raised features 440-1 may be further blasted with a grit and/or bead media to indiscriminately form microscopic texturing. The engineered surface 300-1 is anodized, such that anodization layer 220-1 is formed. In addition, a plasma-resistant spray-coating 230-1 is formed over the anodization layer 220-1.

Each of the plurality of raised features 440-1 has an approximate height "h1". The height "h1" may define the contour of the plurality of raised features 440-1. As shown, the surface 705-1 of the anodization layer 220-1 may closely follow and/or conform to the contour of the plurality of raised features 240-1. Because the outline of the plurality of raised features 440-1 is exposed through the anodization layer 220-1, there is enhanced adhesion of the plasma-resistant spray-coating 230-1 to the anodization layer 220-1.

In addition, the height "h1" is of a particular dimension such that the surface 710 of the plasma-resistant spray-coating 230-1 does not follow and/or conform to the contour of the plurality of raised features 440-1. That is, the height "h1" is of a smaller dimension such that the spray coating 230-1 (typically 2-3 times the thickness of the anodization layer 220-1) fills in the peaks and valleys of the contour of the plurality of raised features 440-1, and further spreads out over the plurality of raised features 440-1 such that the surface 710 is relatively flat.

Figure 7B:
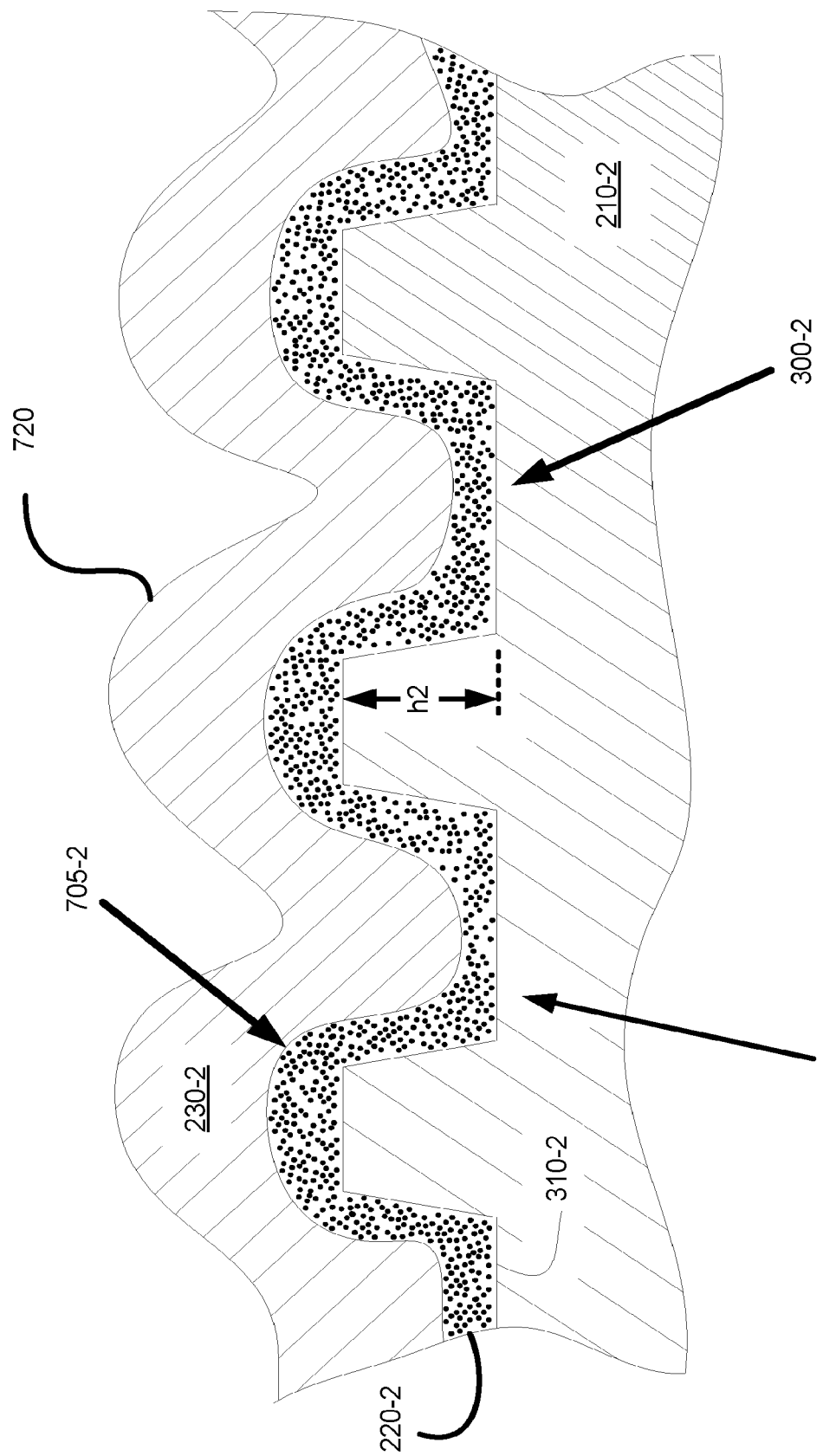
FIG. 7B illustrates a consumable part including an engineered surface that has been anodized and covered with a plasma-resistant spray-coat having a surface exposed to plasma within a plasma processing system, the spray-coat conforming to an engineered surface of the consumable part having macroscopic texturing in the form of raised features that are designed to create additional bonding sites for better adhesion of additional layers and/or byproducts, in accordance with one embodiment of the present disclosure.

FIG. 7B illustrates a consumable part 210-2 including an engineered surface 300-2 that has been anodized (e.g., anodization layer 220-2) and covered with a plasma-resistant spray-coat 230-2 that conforms to an engineered surface 300-2 having macroscopic texturing in the form of raised features that are designed to create additional bonding sites for better adhesion of additional layers, in accordance with one embodiment of the present disclosure.

In particular, the plurality of raised features 440-2 is formed onto a plasma facing side 310-2 of a consumable part 210-2. The plurality of raised features 440-2 defines the engineered surface 300-2. In addition, the plurality of raised features 440-2 may be further blasted with a grit and/or bead media to indiscriminately form microscopic texturing. The engineered surface 300-2 is anodized, such that anodization layer 420-2 is formed. In addition, a plasma-resistant spray-coating 230-2 is formed over the anodization layer 220-2. A surface 720 of the plasma-resistant spray-coating 230-2 is exposed to plasma within a plasma processing system.

Each of the plurality of raised features 440-2 has an approximate height "h2". The height "h2" may define the contour of the plurality of raised features 440-2. As shown, the surface 705-2 of the anodization layer 220-2 may closely follow and/or conform to the contour of the plurality of raised features 440-2. Because the outline of the plurality of raised features 440-2 is exposed through the anodization layer 220-2, there is enhanced adhesion of the plasma-resistant spray-coating 230-2 to the anodization layer 220-2.

In addition, the height "h2" is of a particular dimension such that the surface 720 of the plasma-resistant spray-coating 230-2 follows and/or conforms to the contour of the plurality of raised features 440-2. That is, the height "h2" is of a larger dimension (e.g., height "h2" is greater than height "h1") such that the spray coating 230-2 follows the peaks and valleys of the contour of the plurality of raised features 440-2. As shown, the surface 720 is not relatively flat, and conforms to the contour of the plurality of raised features 440-2.

Figure 8A:
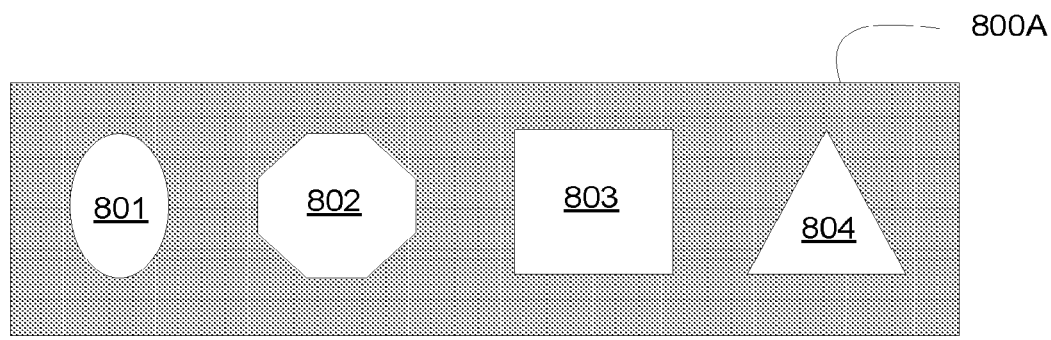
FIG. 8A illustrates a stencil and a plurality of exemplary openings configured to direct media of a grit or bead blasting process onto a plasma facing side of a consumable part in order to build an engineered surface having macroscopic texturing in the form of raised features that are designed to create additional bonding sites for better adhesion of additional layers and/or byproducts, in accordance with one embodiment of the present disclosure.

FIG. 8A illustrates a stencil 800A and a plurality of exemplary openings configured to direct media of a grit or bead blasting process onto a plasma facing side of a consumable part in order to build an engineered surface having macroscopic texturing in the form of raised features that are designed to create additional bonding sites for better adhesion of additional layers, in accordance with one embodiment of the present disclosure. The different types of openings may have different effects when forming corresponding raised features in a plasma facing side of a corresponding consumable part. For example, the shapes of the openings may include, but is not limited to an elliptical opening 801 (e.g., circle, etc.), a multi-sided polygonal opening 802 (e.g., eight sided, etc.), a square or rectangular opening 803, a triangle opening, symmetrical shapes, non-symmetrical shapes, etc. Though openings in stencil are shown as being a circle in stencils throughout the application, the openings can be of any type and shape.

Figure 8B:
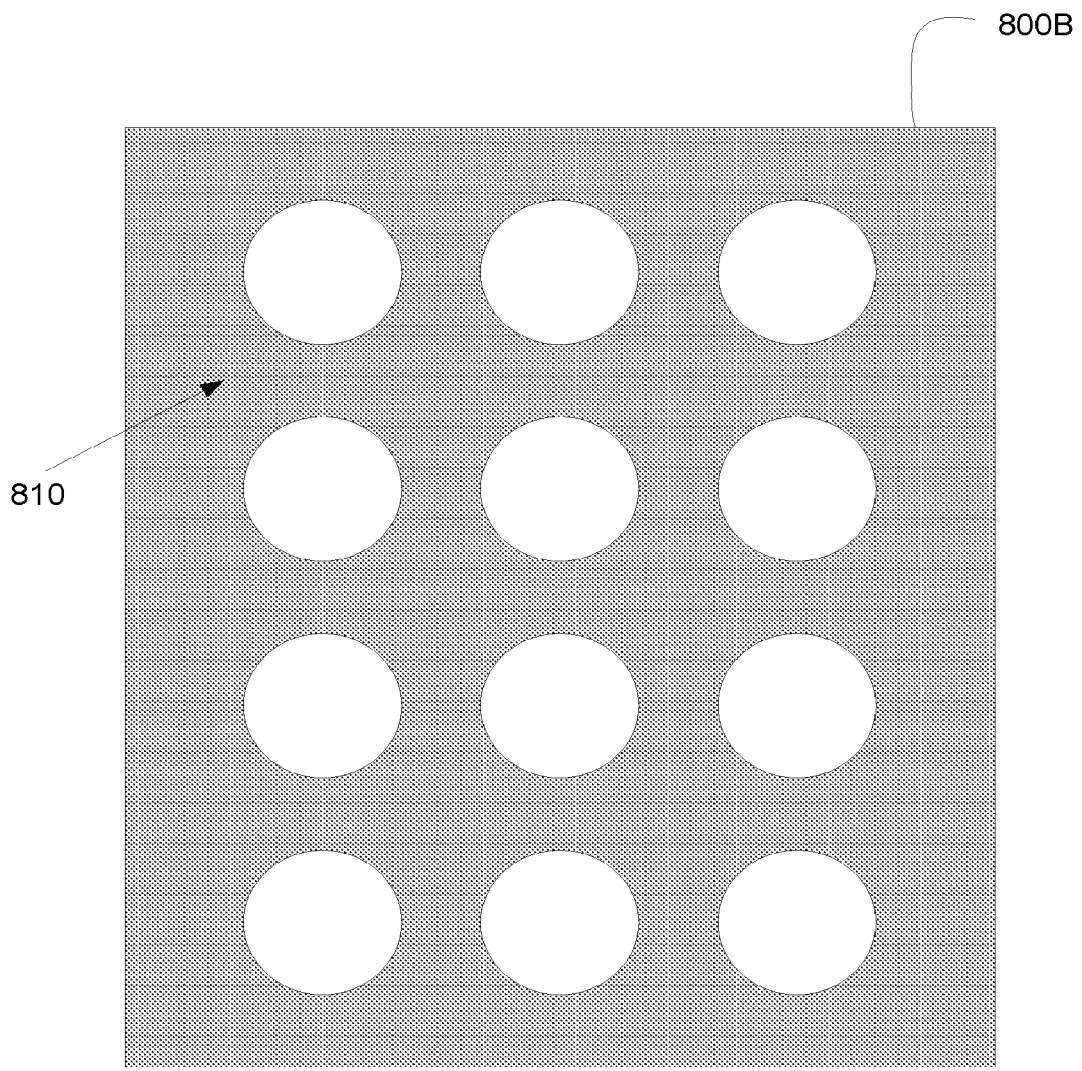
FIG. 8B illustrates a stencil having a plurality of openings arranged in a pattern to direct media of a grit or bead blasting process onto a plasma facing side of a consumable part in order to build an engineered surface having patterned macroscopic texturing designed to create additional bonding sites for better adhesion of additional layers and/or byproducts, in accordance with one embodiment of the present disclosure.

FIG. 8B illustrates a stencil 800B having a plurality of openings arranged in a pattern 810, in accordance with one embodiment of the present disclosure. The patterned stencil 800B is configured to discriminately direct media of a grit or bead blasting process onto a plasma facing side of a consumable part in order to build an engineered surface. In particular, the engineered surface includes patterned macroscopic texturing that are designed to create additional bonding sites for better adhesion of additional layers. The openings in the pattern 810 are repeated throughout the stencil in a uniform manner, in one embodiment, as is shown in FIG. 8B. Further, the shape and size of the openings are selectable, as previously described. In addition, the density of the openings is selectable.

In still another embodiment, the stencil of 800B, used for purposes of illustration only, may be inversed to form a plurality of lowered features that defines the engineered surface. For example, the inverse stencil or mask may be used with media blasting (e.g., grit blasting, bead blasting, etc.) to form the plurality of lowered features, wherein a lowered feature may be a void in the engineered surface (i.e., opposite a raised feature that is solid). In another embodiment, the inverse stencil or mask may be used with chemical etching to form the plurality of lowered features.

Figure 8C:
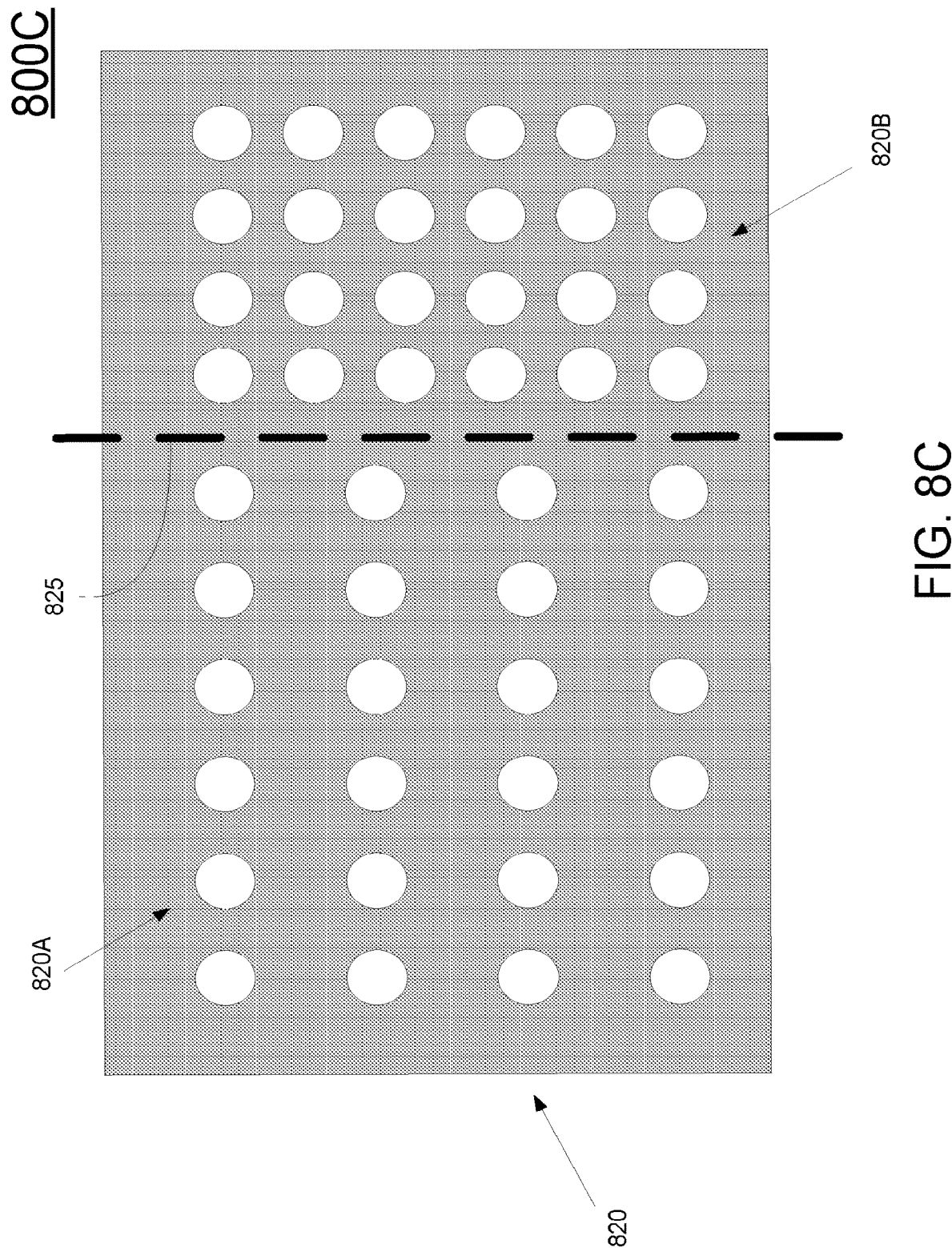
FIG. 8C illustrates a stencil having a plurality of openings arranged in a two-zoned pattern to direct media of a grit or bead blasting process onto a plasma facing side of a consumable part in order to build an engineered surface having patterned macroscopic texturing designed to create additional bonding sites for better adhesion of additional layers and/or byproducts, in accordance with one embodiment of the present disclosure.

FIG. 8C illustrates a stencil 800C having a plurality of openings arranged in a two-zoned pattern to direct media of a grit or bead blasting process onto a plasma facing side of a consumable part in order to build an engineered surface having patterned macroscopic texturing designed to create additional bonding sites for better adhesion of additional layers, in accordance with one embodiment of the present disclosure. In particular, the stencil 800C includes a defined pattern 820 that includes a first zone 820A and a second zone 820B, wherein line 825 separates the two zones.

Openings in the two zones are shown as being circles or ellipses, but can be of any shape. In addition, the openings in the first zone 820A may be of a first type (e.g., circle), and openings in the second zone 820B may be of a second type (e.g., square). In addition, though the sizes of the openings in the first zone 820A and second zone 820B are uniform, the size of openings in the first zone 820A may be of a first size, and the openings in the second zone 820B may be a second size. The size and shape of the openings may control the size and shape of the correspondingly formed macroscopic features.

The first zone 820A includes a first set of raised features arranged in a first sub-pattern. The second zone 820B includes a second set of raised features arranged in a second sub-pattern. In addition, the sub-patterns of the first zone 820A and second zone 820B may closely follow each other, or may be distinct from each other. As shown in FIG. 8C, the first sub-pattern of the first zone 820A is similar to the sub-pattern of the second zone 820B, such that both follow a uniform displacement (e.g., lateral, vertical, and/or diagonal displacement) between openings. However, the densities of openings in the two zones are different. In particular, the density of openings in the first zone 820A is less than the density of openings in the second zone 820B.

Figure 8D:
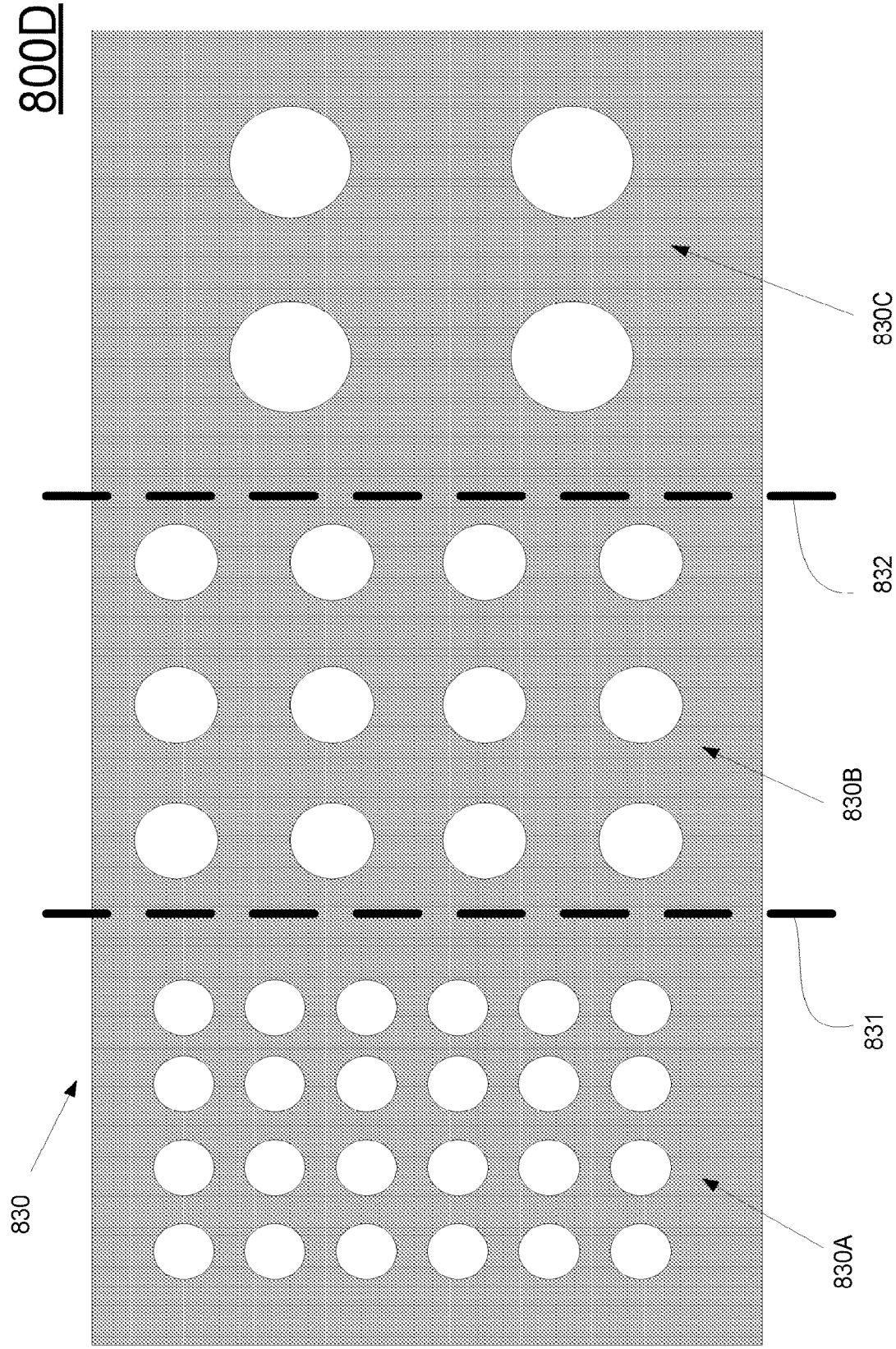
FIG. 8D illustrates a stencil having a plurality of openings arranged in a three-zoned pattern to direct media of a grit or bead blasting process onto a plasma facing side of a consumable part in order to build an engineered surface having patterned macroscopic texturing designed to create additional bonding sites for better adhesion of additional layers and/or byproducts, in accordance with one embodiment of FIG. 8E illustrates a stencil having a plurality of openings that are arranged in a linearly scaled pattern to direct media of a grit or bead blasting process onto a plasma facing side of a consumable part in order to build an engineered surface having patterned macroscopic texturing designed to create additional bonding sites for better adhesion of additional layers and/or byproducts, in accordance with one embodiment of the present disclosure.

FIG. 8D illustrates a stencil 800D having a plurality of openings arranged in a three-zoned pattern to direct media of a grit or bead blasting process onto a plasma facing side of a consumable part in order to build an engineered surface having patterned macroscopic texturing designed to create additional bonding sites for better adhesion of additional layers, in accordance with one embodiment of the present disclosure. In particular, the stencil 800D includes a defined pattern 830 that includes a first zone 830A, a second zone 830B, and a third zone 830C. Line 831 separates the first zone 830A from the second zone 830B, and line 832 separates the second zone 830B from the third zone 830C.

Openings in the three zones are shown as being circles or ellipses, but can be of any shape. In addition, the openings in the first zone 830A may be of a first type (e.g., circle), and openings in the second zone 830B may be of a second type (e.g., square), and openings in the third zone 830C may be of the first or second type, or of a third type (e.g., triangle). In addition, though the sizes of the openings in the three zones are shown to be uniform, the size of openings in the first zone 830A may be of a first size, the openings in the second zone 830B may be a second size, and the openings in the third zone 830C may be of a third size. That is, the sizes of openings in each of the three zones may be similar or different. The size and shape of the openings may control the size and shape of the correspondingly formed macroscopic features.

The first zone 830A includes a first set of raised features arranged in a first sub-pattern. The second zone 830B includes a second set of raised features arranged in a second sub-pattern. The third zone 830C includes a third set of raised features arranged in a third sub-pattern. In addition, the sub-patterns of the three zones may closely follow each other, or may be distinct from each other. As shown, the sub-patterns of each of the three zones are similar to each other, such that each follow a uniform displacement (e.g., lateral, vertical, and/or diagonal displacement) between openings. However, the densities of openings in the three zones are different. In particular, the density of openings in the first zone 830A is the greatest of the three zones. The density of openings in the third zone 830C is the smallest of the three zones. Further, the density of openings in the second zone is smaller than the density of openings in the first zone 830A, but is greater than the density of openings in the third zone 830C.

Figure 8E:
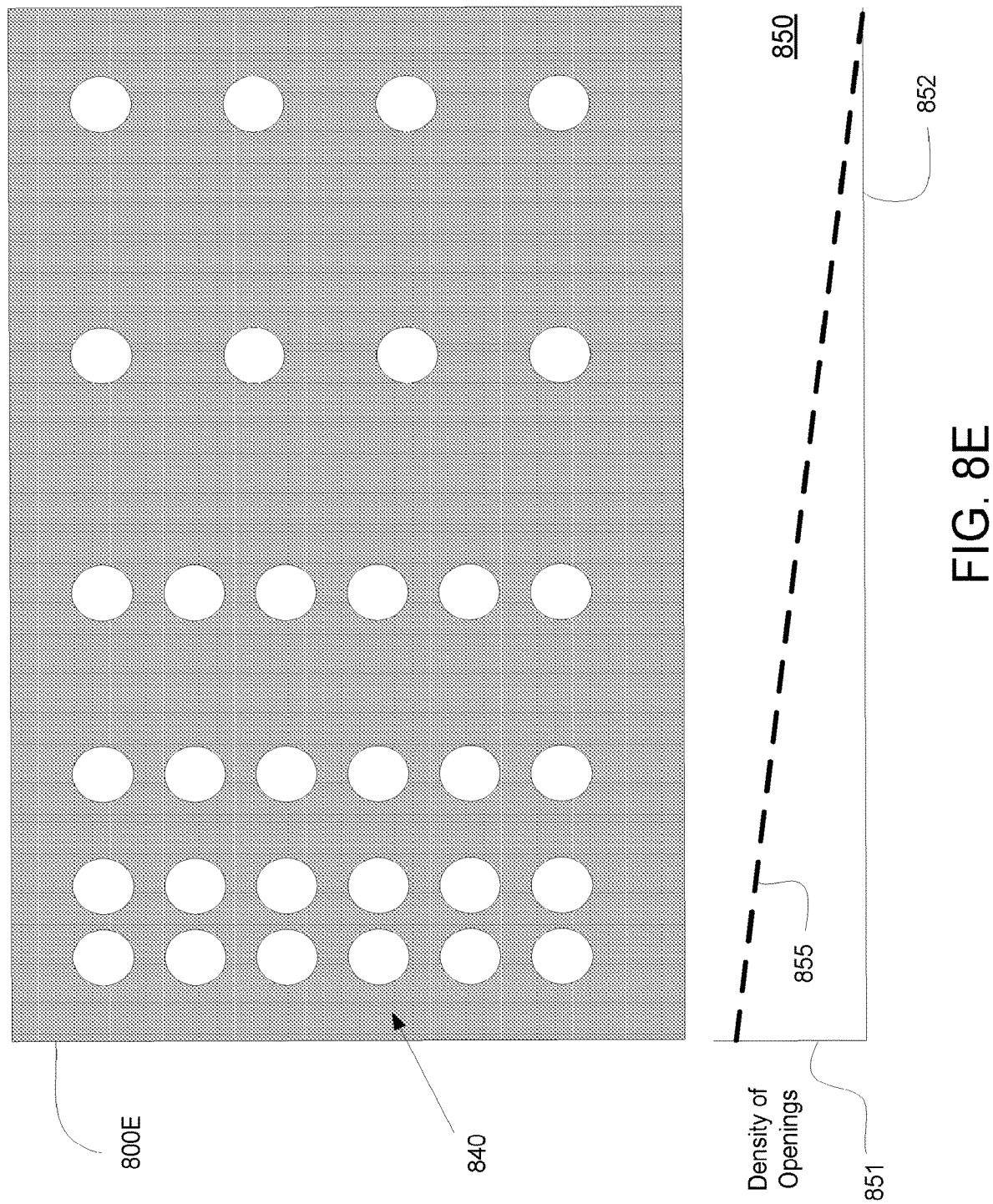

FIG. 8E illustrates a stencil 800E having a plurality of openings that are arranged in a linearly scaled pattern to direct media of a grit or bead blasting process onto a plasma facing side of a consumable part in order to build an engineered surface having patterned macroscopic texturing designed to create additional bonding sites for better adhesion of additional layers, in accordance with one embodiment of the present disclosure. In particular, plot 850 shows the density of openings in the stencil 800E while moving in a particular direction across the stencil. For example, plot 850 includes a vertical axis 851 showing the density of openings in the stencil 800E, and a horizontal axis 852 showing distance across the stencil 800E in a particular direction. Following plot 850, on the left side of stencil 800E, the density of openings is highest. Moving across the stencil 800E from left to right, the density linearly decreases, until the density of openings reaches a minimum (e.g., zero) all the way to the right of the stencil 800E.

Openings in the stencil 800E are shown as being circles or ellipses, but can be of any shape. In addition, the openings may change shape throughout the stencil 800E, as well as in sub-patterns in any of the stencils. Also, although the sizes of the openings are shown to be uniform throughout the stencil 800E, the sizes of openings may vary throughout. The size and shape of the openings may control the size and shape of the correspondingly formed macroscopic features.

FIGS. 9A-1, 9A-2, 9B-1, 9B-2, 9C-1, 9C-2, 9D, 9E illustrate different configurations and pattern of raised featured arranged across a corresponding engineered surface, and are provided merely for purposes of illustration and clarity. Features may be formed across an engineered surface in customized patterns, wherein features are formed depending on selectable parameters, such as size, shape, density of raised features, etc.

Figures 1, 9A:
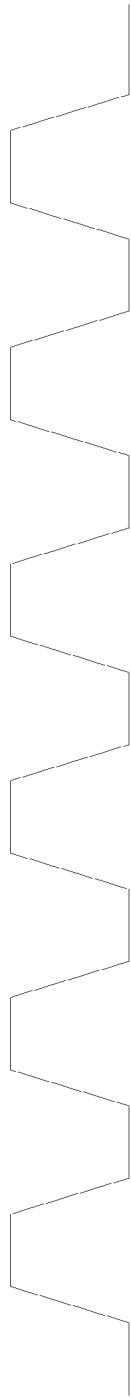
Figures 2, 9A:

FIG. 9A-1 illustrates a plurality of raised features uniformly arranged across a corresponding engineered surface in a pattern 910, in accordance with one embodiment of the present disclosure. The raised features defining the engineered surface include patterned macroscopic texturing that is designed to create additional bonding sites for better adhesion of additional layers and/or byproducts. The features are of a uniform structure and height configured to build a conformal plasma-resistant spray-coat (not shown), as previously described. That is, the spray-coating has a contour that conforms similarly to the contour of the engineered surface. For example, the height of the macroscopic raised features and the separation between the raised features in the pattern 910 may allow the top surface of the spray-coating to conform approximately to the contour of the engineered surface in pattern 910.

FIG. 9A-2 illustrates a plurality of raised features uniformly arranged with less density than the features of FIG. 9A-1, in accordance with one embodiment of the present disclosure. The features of FIG. 9A-2 are uniformly arranged across the corresponding engineered surface in a pattern 920. The features in FIG. 9A-2 are similarly configured as the features in FIG. 9A-1, and are of a uniform structure and height configured to build a conformal plasma-resistant spray-coat, as previously described. However, the density of the features in pattern 920 of FIG. 9A-2 is less than the density of features in pattern 910 of FIG. 9A-1 to show that the density is selectable. In addition, the size and shape of the features in each of the patterns 910 and 920 are selectable.

Figures 1, 9B:
Figures 2, 9B:

FIG. 9B-1 illustrates a plurality of raised features uniformly arranged in a pattern 930, in accordance with one embodiment of the present disclosure. The features of pattern 930 are of a uniform structure and height. In particular, the height of features of pattern 930 is less than the height of features of pattern 910 of FIG. 9A-1. The features of pattern 930 are of a uniform structure and height configured to build a non-conformal plasma-resistant spray-coat that is relatively flat, as previously described. That is, the spray-coating has a contour that does not conform to the contour of the engineered surface. The raised features define an engineered surface having patterned macroscopic texturing designed to create additional bonding sites for better adhesion of additional layers. For example, the height of the macroscopic raised features and the separation between the raised features in the pattern 930 may not allow the top surface of the spray-coating to conform approximately to the contour of the engineered surface in pattern 930.

FIG. 9B-2 illustrates a plurality of raised features uniformly arranged with less density that the features of FIG. 9B-1, in accordance with one embodiment of the present disclosure. The features of FIG. 9B-2 are uniformly arranged across the corresponding engineered surface in a pattern 940. The features in FIG. 9B-2 are similarly configured as the features in FIG. 9B-1, and are of a uniform structure and height configured to build a non-conformal plasma-resistant spray-coat, as previously described. The density of the features in pattern 940 of FIG. 9B-2 is less than the density of features in pattern 930 of FIG. 9B-1 to show that the density is selectable. In addition, the size and shape of the features in each of the patterns 930 and 940 are selectable.

FIG. 9C-1 illustrates a plurality of raised features arranged in a pattern 950 that further includes two sub-patterns 950A and 950B, in accordance with one embodiment of the present disclosure. The raised features in the two sub-patterns 950A and 950B define an engineered surface having patterned macroscopic texturing designed to create additional bonding sites for better adhesion of additional layers and/or byproducts. Features across each of the two sub-patterns 950A and 950B are of a uniform structure and height to build a conformal plasma-resistant spray-coat (not shown), as previously described. That is, the spray-coating has a contour that conforms similarly to the contour of the engineered surface. For example, the height of the macroscopic raised features and the separation between the raised features in the pattern 910 may allow the top surface of the spray-coating to conform approximately to the contour of the engineered surface in pattern 910. Though the features are shown to be uniform across each of the two sub-patterns 950A and 950B, the density of the features in sub-pattern 950B (to the right side) is less than the density of the features in the sub-pattern 950A (to the left side), and shows that density of the raised features in each of the sub-patterns 950A and 950B are selectable. Further, though the features are shown to be uniform across each of the two sub-patterns 950A and 950B, the features may have different configurations, as is shown further in FIG. 9C-2.

FIG. 9C-2 illustrates a plurality of raised features arranged in two sub-patterns 960A and 960B, wherein features in each sub-patterns are of a uniform structure and height but may vary between the two sub-patterns, in accordance with one embodiment of the present disclosure. The raised features in the two sub-patterns 960A and 960B define an engineered surface having patterned macroscopic texturing designed to create additional bonding sites for better adhesion of additional layers and/or byproducts. Features across each of the two sub-patterns 960A and 960B have different configurations. In particular, features in sub-pattern 960A are of a uniform structure and height to build a conformal plasma-resistant spray-coat (not shown), as previously described. For example, the height of the macroscopic raised features and the separation between the raised features in the sub-pattern 960A may allow the top surface of the spray-coating to conform similarly and/or approximately to the contour of the engineered surface in sub-pattern 960A. On the other hand, features in sub-pattern 960B are of a uniform structure and height to build a non-conformal plasma-resistant spray-coat, as previously described. For example, the height of the macroscopic raised features and the separation between the raised features in the sub-pattern 960B may not allow the top surface of the spray-coating to conform similarly and/or approximately to the contour of the engineered surface in sub-pattern 960B. That is, the top surface of the spray-coating has a contour that does not conform to the raised features of sub-pattern 960B. As such, the spray-coating may have different contours depending on the underlying sub-pattern of raised features. Though the features are shown to have the same density across both sub-patterns 960A and 960B, the density of features could vary between the two sub-patterns 960A and 960B, such that the density of the raised features in each of the sub-patterns 960A and 960B are selectable. For example, the density of the features in sub-pattern 960B (to the right side) may be less than the density of the features in the sub-pattern 960A (to the left side), or vice versa.

Figure 9D:
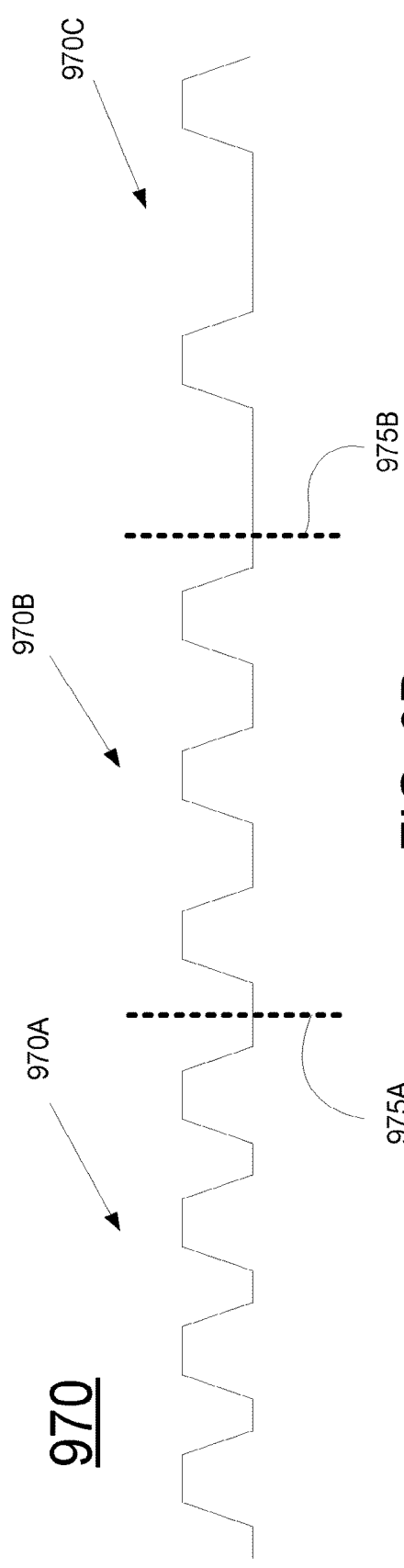
FIG. 9D illustrates a plurality of raised features arranged in three sub-patterns, wherein features across the sub-patterns are of a uniform structure and height, wherein the raised features define an engineered surface having patterned macroscopic texturing designed to create additional bonding sites for better adhesion of additional layers and/or byproducts, in accordance with one embodiment of the present disclosure.

FIG. 9D illustrates a plurality of raised features arranged in three sub-patterns (970A, 970B and 970C), wherein features across the sub-patterns are of a uniform structure and height, in accordance with one embodiment of the present disclosure. The raised features in the three sub-patterns 970A, 970B, and 970C define an engineered surface having patterned macroscopic texturing designed to create additional bonding sites for better adhesion of additional layers and/or byproducts. Features across each of the three sub-patterns may have the same configurations. For example, features in the three sub-patterns may be of a uniform structure and height to build a conformal or non-conformal plasma-resistant spray-coat (not shown), as previously described. For example, the height of the macroscopic raised features and the separation between the raised features in the three sub-patterns may allow the top surface of the spray-coating to conform similarly and/or approximately to the contour of the engineered surface depending on the underlying sub-pattern. Or, the height of the macroscopic raised features and the separation between the raised features in the three sub-patterns may not allow the top surface of the spray-coating to conform similarly and/or approximately to the contour of the engineered surface. Though the features are shown to be uniform across each of the three sub-patterns, in other embodiments, the configuration (e.g., size and shape) of features in one sub-pattern may be distinct over the configuration of features in another sub-pattern depending on the underlying sub-pattern. More particularly, the density of features in each of the sub-patterns 970A, 970B, and 970C have different densities. In particular, the density of features in sub-pattern 970A is highest, and the density of features in sub-pattern 970C is lowest. In addition, the density of features in sub-pattern 970B is greater than the density of features in sub-pattern 970C, but is less than the density of features in sub-pattern 970A.

Figure 9E:
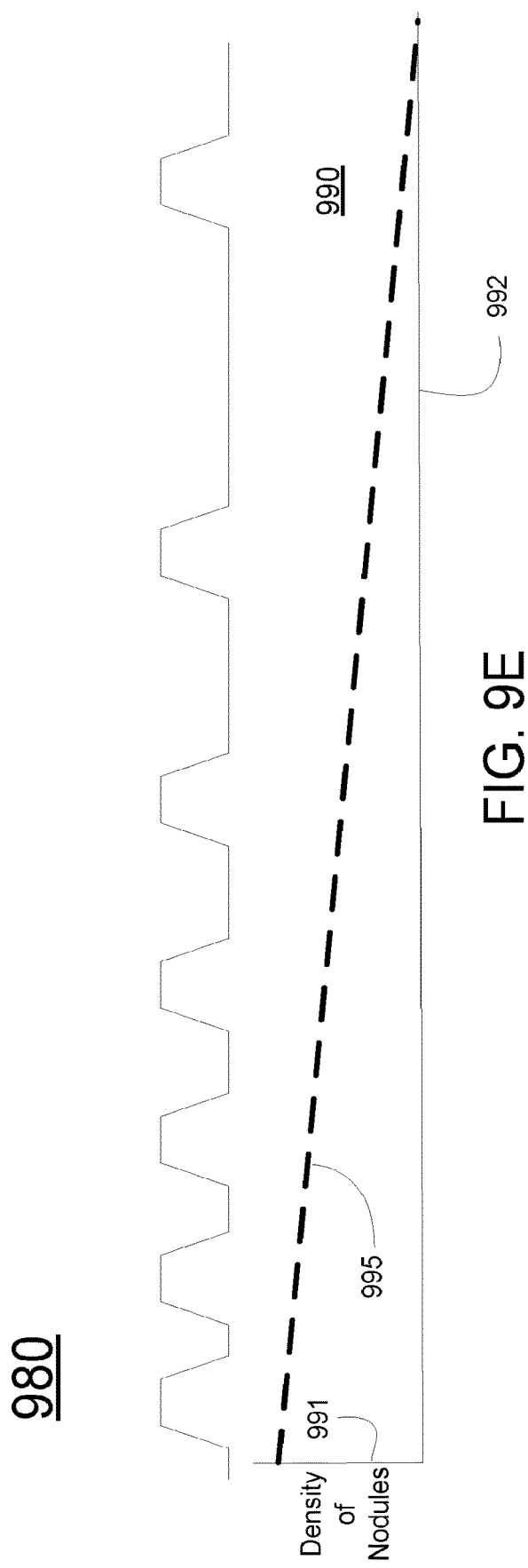
FIG. 9E illustrates a plurality of raised features arranged in a linearly scaled pattern, such that the density of features increases linearly, wherein the raised features define an engineered surface having patterned macroscopic texturing designed to create additional bonding sites for better adhesion of additional layers and/or byproducts, in accordance with one embodiment of the present disclosure.

FIG. 9E illustrates a plurality of raised features arranged in a linearly scaled pattern 980, such that the density of features increases linearly, in accordance with one embodiment of the present disclosure. The raised features define an engineered surface having patterned macroscopic texturing designed to create additional bonding sites for better adhesion of additional layers and/or byproducts. Purely for illustration, the features in pattern 980 may have been formed using stencil 800E of FIG. 8E. In particular, features across the engineered surface may have the same configurations. For example, features in pattern 980 may be of a uniform structure and height to build a conformal or non-conformal plasma-resistant spray-coat (not shown), as previously described. Though the features are shown to be uniform across the engineered surface, in other embodiments the configuration (e.g., size and shape) of features may vary across the engineered surface. Plot 990 shows the density of raised features in pattern 980. For example, plot 990 includes a vertical axis 991 showing the density of raised features (e.g., nodules) and a horizontal axis 992 showing distance across an engineered surface in a particular direction. Following plot 990, the density of raised features is highest to the left side of pattern 980 in a particular direction. Moving across the pattern 980 showing the engineered surface along a particular direction, the density of raised features linearly decreases, until the density of raised opening reaches a minimum (e.g., zero) all the way to the right of pattern 980.

Figure 10:
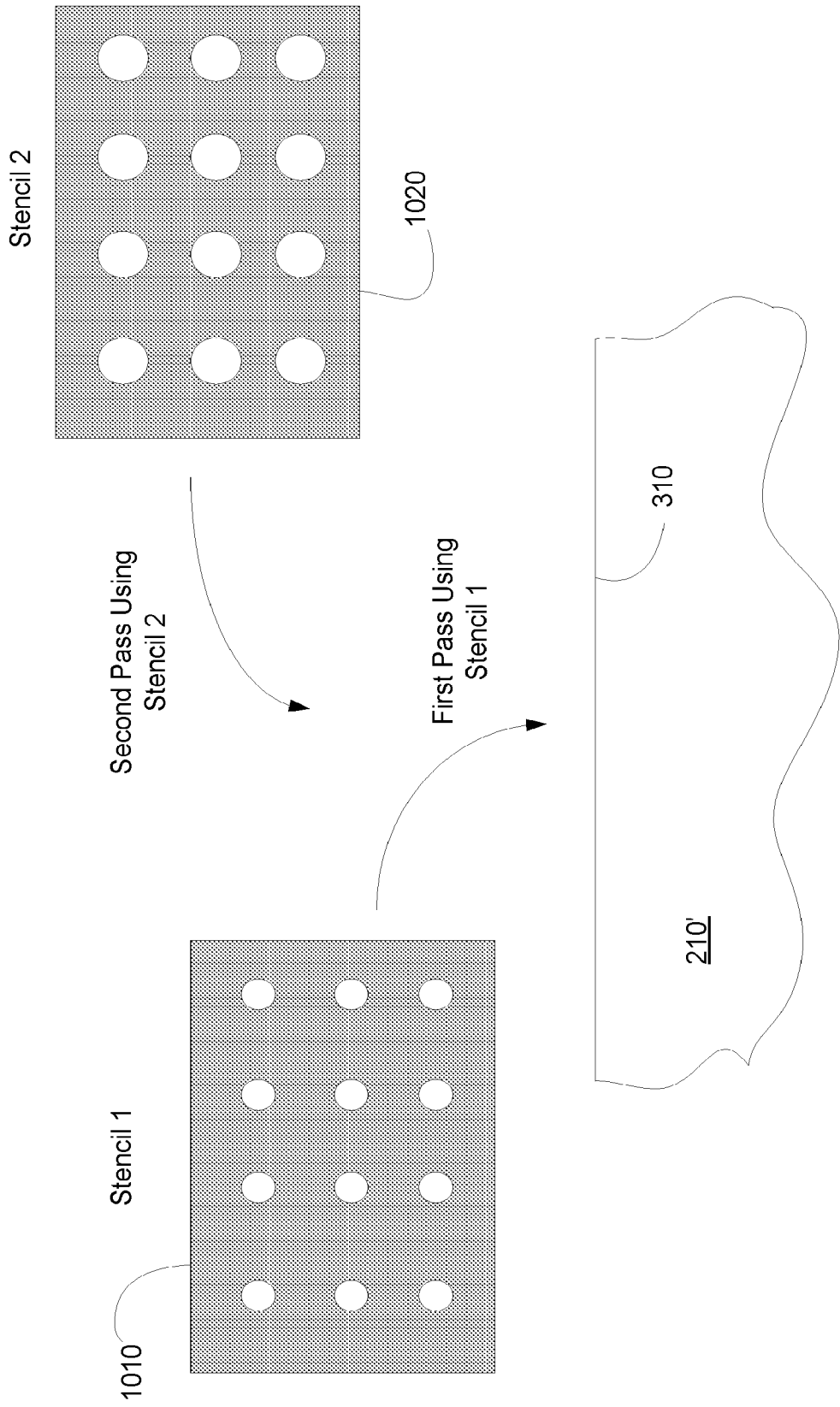
FIG. 10 illustrates a process of applying different stencils to a plasma facing side of a consumable part to generate rounded edges in a plurality of raised features arranged in a pattern, in accordance with one embodiment of the present disclosure.

FIG. 10 illustrates a process of applying different stencils to a plasma facing side 310 of a consumable part 210' to generate a described configuration of features (e.g., rounded edges) in a plurality of raised features arranged in a pattern, in accordance with one embodiment of the present disclosure. For example, bead and/or grit blasting with corresponding blast media is performed in two passes. In the first pass, bead and/or grit blasting with a first blast media is performed using stencil 1. The bead and/or grit blasting may be moved across the stencil 1 (1010) following a prescribed pattern, and at one or more prescribed angles (e.g., the angle of the blaster nozzle). In the second pass, bead and/or grit blasting with a second blast media is performed using stencil 2 (1020). The first and second blast media may be identical or different. The bead and/or grit blasting may be moved across the stencil 2 following a prescribed pattern, and at one or more prescribed angles (e.g., the angle of the blaster nozzle). The use of different stencils 1 and 2 may promote a desired edge to the raised features defining the engineered surface. For example, the openings in stencil 2 may be larger than the openings in stencil 1, but both patterns of openings generally follow the same pattern. In that manner, during the second pass, the blast media may reach additional areas of the plasma facing side 310 of the consumable part 210' to create rounded corners to the outer edge of the top regions of a plurality of raised features formed into and defining the engineered surface, as is shown in FIGS. 4A-4B.

Figure 11:
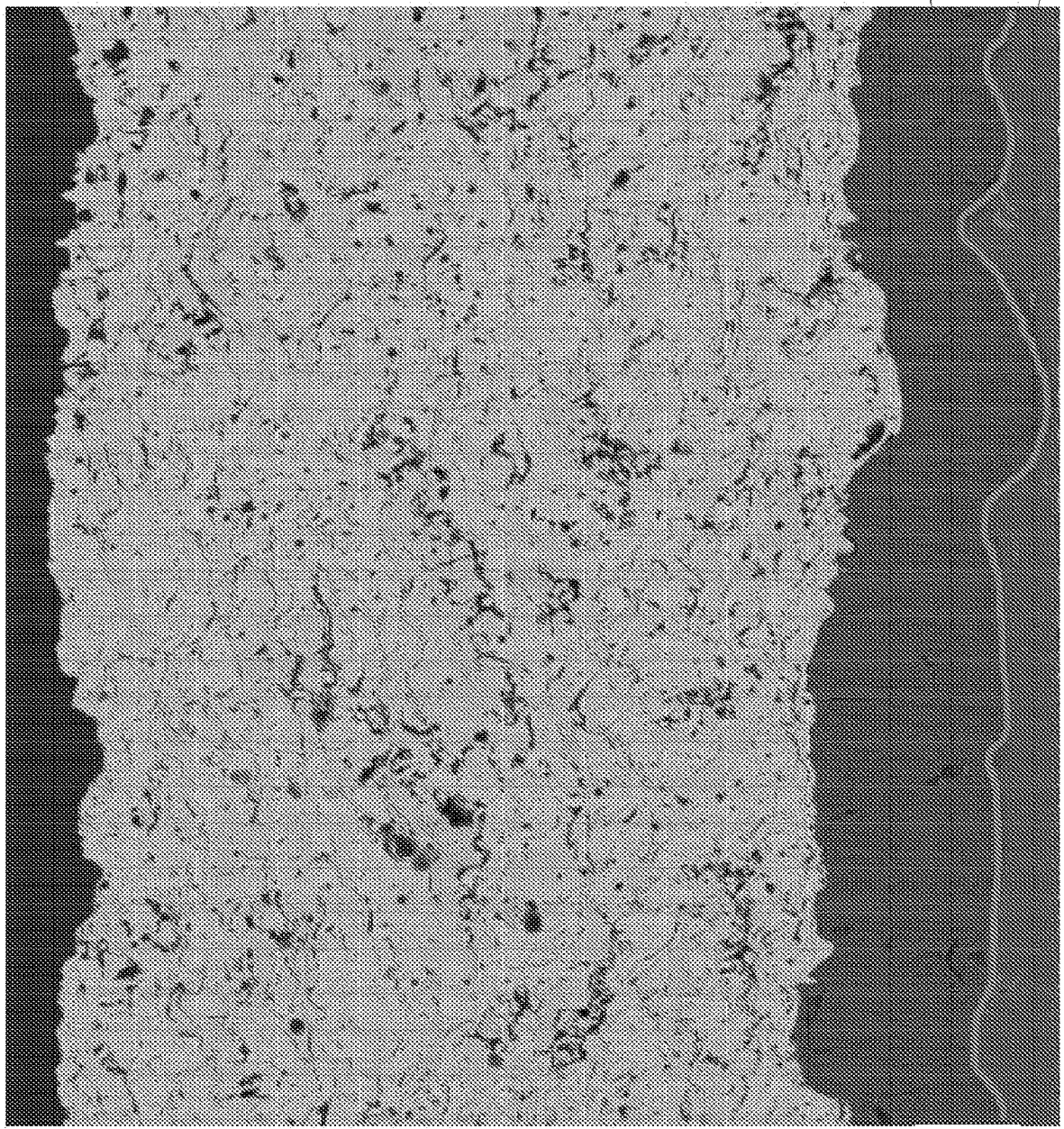
FIG. 11 is an electron microscope image of a cross-section of a consumable part including an engineered surface that has been anodized and covered with a plasma-resistant spray-coat, the engineered surface having macroscopic texturing in the form of raised features that are designed to create additional bonding sites for better adhesion of additional layers, in accordance with one embodiment of the present disclosure.

FIG. 11 is an electron microscope image of a cross-section of a consumable part 210-3 including an engineered surface that has been anodized (anodized layer 220-3) and covered with a plasma-resistant spray-coat 230-3, in accordance with one embodiment of the present disclosure. The engineered surface includes macroscopic texturing in the form of raised features that are designed to create additional bonding sites for better adhesion of additional layers and/or byproducts, in accordance with one embodiment of the present disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A consumable part for a plasma processing chamber, comprising:
   a plasma facing side of the consumable part;
   an engineered surface formed into the plasma facing side of the consumable part;
   a plurality of raised features defining the engineered surface, wherein features of the plurality of raised features are arranged in a predefined pattern, wherein each of the plurality of raised features includes a top region having an outer edge and a sidewall; and
   a base surface of the engineered surface that surrounds the each of the plurality of raised features, such that a corresponding sidewall of a corresponding raised feature extends up at an angle from the base surface to a corresponding top region,
   wherein the consumable part is configured to be installed in the plasma processing chamber,
   wherein the consumable part is configured to be exposed to a plasma and byproducts of the plasma.

2. The consumable part of claim 1, wherein the angle ranges between about 15 degrees to about 60 degrees.

3. The consumable part of claim 1,
   wherein the features of the plurality of raised features are macroscopic with heights of corresponding raised features with reference to the base surface ranging between about 0.2 mm to about 3 mm.

4. The consumable part of claim 1, wherein the consumable part comprises one of the following:
   a liner configured to protect an inner wall of the plasma processing chamber; or
   one or more portions of a C-shroud; or
   one or more portions of a plasma confinement ring; or
   a focus ring; or
   an edge ring; or
   an electrostatic semiconductor wafer clamping/chucking system; or
   an upper electrode; or
   a dielectric window for inductively coupled plasmas; or
   a bottom electrode.

5. The consumable part of claim 1, further comprising:
   a plurality of microscopic features indiscriminately applied to the plurality of raised features.

6. The consumable part of claim 1,
   wherein the predefined pattern includes a first zone and a second zone,
   wherein the first zone includes a first set of raised features arranged in a first sub-pattern,
   wherein the second zone includes a second set of raised features arranged in a second sub-pattern.

7. The consumable part of claim 1,
   wherein the plasma facing side of the consumable part is a conductive material or a dielectric material.

8. The consumable part of claim 1, further comprising:
   an anodization layer formed over the engineered surface, wherein the anodization layer adheres to the engineered surface; and a coating formed over the anodization layer, wherein the plurality of raised features is configured to enhance adhesion of the coating onto the anodization layer, wherein the coating adheres to a surface of the anodization layer.

9. The consumable part of claim 8,
wherein the anodization layer conforms to a contour formed from the plurality of raised features.

10. The consumable part of claim 8,
wherein the coating is continuous and layered over the anodization layer, such that the anodization layer and the coating cover the plurality of raised features.

11. The consumable part of claim 1,
wherein the corresponding sidewall of the corresponding raised feature extends up uniformly at the angle,
wherein the angle, defined between a center axis of the corresponding raised feature and the corresponding sidewall, is between 15 to 80 degrees.

12. The consumable part of claim 1,
a non-conforming coating formed over the plurality of raised features.

* * * * *